(12) United States Patent
Akram et al.

(10) Patent No.: US 7,154,354 B2
(45) Date of Patent: Dec. 26, 2006

(54) HIGH PERMEABILITY LAYERED MAGNETIC FILMS TO REDUCE NOISE IN HIGH SPEED INTERCONNECTION

(75) Inventors: Salman Akram, Boise, ID (US); Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/063,132

(22) Filed: Feb. 22, 2005

(65) Prior Publication Data

US 2005/0140462 A1 Jun. 30, 2005

Related U.S. Application Data

(63) Continuation of application No. 10/443,021, filed on May 22, 2003, now Pat. No. 6,970,053.

(51) Int. Cl.
H01P 5/12 (2006.01)
(52) U.S. Cl. .............................. 333/1; 333/33
(58) Field of Classification Search ............... 333/1, 333/22, 33, 246
See application file for complete search history.

(56) References Cited

U.S. PATENT DOCUMENTS

| | | | |
|---|---|---|---|
| 3,478,230 A | 11/1969 | Otter et al. | |
| 3,676,718 A | 7/1972 | Anderson et al. | |
| 3,816,673 A | 6/1974 | Miya | |
| 4,308,421 A | 12/1981 | Bogese, II | |
| 4,372,032 A | 2/1983 | Collins et al. | |
| 4,640,871 A | 2/1987 | Hayashi et al. | |
| 4,749,888 A | 6/1988 | Sakai et al. | |
| 4,933,743 A | 6/1990 | Thomas et al. | |
| 4,962,476 A | 10/1990 | Kawada | |
| 5,019,728 A | 5/1991 | Sanwo et al. | |
| 5,128,962 A | 7/1992 | Kerslake et al. | |
| 5,135,889 A | 8/1992 | Allen | |
| 5,165,046 A | 11/1992 | Hesson | |
| 5,223,808 A | 6/1993 | Lee et al. | |
| 5,352,998 A | 10/1994 | Tanino | |
| 5,363,550 A | 11/1994 | Aitken et al. | |
| 5,450,026 A | 9/1995 | Morano | |
| 5,510,758 A | 4/1996 | Fujita et al. | |
| 5,521,536 A | 5/1996 | Yamashita et al. | |
| 5,619,159 A | 4/1997 | Sasaki et al. | |
| 5,656,548 A | 8/1997 | Zavracky et al. | |
| 5,729,047 A | 3/1998 | Ma | |
| 5,772,153 A | 6/1998 | Abaunza et al. | |
| 5,811,984 A | 9/1998 | Long et al. | |
| 5,880,601 A | 3/1999 | Kanazawa et al. | |
| 5,910,684 A | 6/1999 | Sandhu et al. | |

(Continued)

OTHER PUBLICATIONS

Aarik, Jaan, et al., "Atomic layer deposition of TiO2 thin films from TiI4 and H2O", *Applied Surface Science 193*, (2002), 277-286, no month.

(Continued)

*Primary Examiner*—Lam T. Mai
(74) *Attorney, Agent, or Firm*—Schwegman, Lundberg, Woessner & Kluth, P.A.

(57) ABSTRACT

A structure for magnetically shielded transmission lines for use with high speed integrated circuits having an improved signal to noise ratio, and a method for forming the same are disclosed. At least one magnetic shield structure contains electrically induced magnetic fields generated around a number of transmission lines. The shield material is made of alternating layers of magnetic material and insulating material.

77 Claims, 17 Drawing Sheets

U.S. PATENT DOCUMENTS

| | | | |
|---|---|---|---|
| 6,022,787 A | 2/2000 | Ma | |
| 6,075,383 A | 6/2000 | Terletski | |
| 6,133,621 A | 10/2000 | Gaibotti et al. | |
| 6,143,616 A | 11/2000 | Geusic et al. | |
| 6,224,690 B1 | 5/2001 | Andricacos et al. | |
| 6,226,599 B1 | 5/2001 | Namiki | |
| 6,255,852 B1 | 7/2001 | Forbes et al. | |
| 6,281,042 B1 | 8/2001 | Ahn et al. | |
| 6,313,531 B1 | 11/2001 | Geusic et al. | |
| 6,350,649 B1 | 2/2002 | Jeong et al. | |
| 6,355,561 B1 | 3/2002 | Sandhu et al. | |
| 6,373,740 B1 | 4/2002 | Forbes et al. | |
| 6,414,476 B1 | 7/2002 | Yagi | |
| 6,420,778 B1 | 7/2002 | Sinyansky | |
| 6,433,408 B1 | 8/2002 | Anjo et al. | |
| 6,461,436 B1 | 10/2002 | Campbell et al. | |
| 6,541,353 B1 | 4/2003 | Sandhu et al. | |
| 6,545,338 B1 | 4/2003 | Bothra et al. | |
| 6,551,893 B1 | 4/2003 | Zheng et al. | |
| 6,555,858 B1 | 4/2003 | Jones et al. | |
| 6,569,757 B1 | 5/2003 | Weling et al. | |
| 6,570,248 B1 | 5/2003 | Ahn et al. | |
| 6,600,339 B1 | 7/2003 | Forbes et al. | |
| 6,603,080 B1 | 8/2003 | Jensen | |
| 6,656,835 B1 | 12/2003 | Marsh et al. | |
| 6,673,701 B1 | 1/2004 | Marsh et al. | |
| 6,692,898 B1 | 2/2004 | Ning | |
| 6,727,105 B1 | 4/2004 | Brug et al. | |
| 6,730,163 B1 | 5/2004 | Vaartstra | |
| 6,730,367 B1 | 5/2004 | Sandhu | |
| 6,737,887 B1 | 5/2004 | Forbes et al. | |
| 6,746,934 B1 | 6/2004 | Sandhu et al. | |
| 6,756,237 B1 | 6/2004 | Xiao et al. | |
| 6,764,919 B1 * | 7/2004 | Yu et al. | 438/421 |
| 6,764,941 B1 | 7/2004 | Yang et al. | |
| 6,784,045 B1 | 8/2004 | Price et al. | |
| 6,787,463 B1 | 9/2004 | Mardian et al. | |
| 6,787,888 B1 | 9/2004 | Forbes et al. | |
| 6,787,906 B1 | 9/2004 | Yang et al. | |
| 6,794,735 B1 | 9/2004 | Forbes et al. | |
| 6,815,804 B1 | 11/2004 | Forbes | |
| 6,833,317 B1 | 12/2004 | Forbes et al. | |
| 6,844,256 B1 | 1/2005 | Forbes et al. | |
| 6,846,738 B1 | 1/2005 | Forbes et al. | |
| 6,852,613 B1 | 2/2005 | Forbes et al. | |
| 6,884,706 B1 | 4/2005 | Forbes et al. | |
| 6,900,116 B1 | 5/2005 | Forbes et al. | |
| 6,903,003 B1 | 6/2005 | Forbes et al. | |
| 6,903,444 B1 | 6/2005 | Forbes et al. | |
| 6,906,402 B1 | 6/2005 | Forbes et al. | |
| 6,914,278 B1 | 7/2005 | Forbes et al. | |
| 6,916,668 B1 * | 7/2005 | Spielberger et al. | 438/3 |
| 2001/0000428 A1 | 4/2001 | Abadeer et al. | |
| 2002/0145901 A1 | 10/2002 | Forbes et al. | |
| 2003/0045082 A1 | 3/2003 | Eldridge et al. | |
| 2003/0142569 A1 | 7/2003 | Forbes et al. | |
| 2003/0173652 A1 | 9/2003 | Forbes et al. | |
| 2003/0173653 A1 | 9/2003 | Forbes et al. | |
| 2003/0174529 A1 | 9/2003 | Forbes et al. | |
| 2003/0176023 A1 | 9/2003 | Forbes et al. | |
| 2003/0176025 A1 | 9/2003 | Forbes et al. | |
| 2003/0176050 A1 | 9/2003 | Forbes et al. | |
| 2003/0176052 A1 | 9/2003 | Forbes et al. | |
| 2003/0176053 A1 | 9/2003 | Forbes et al. | |
| 2003/0207032 A1 | 11/2003 | Ahn et al. | |
| 2003/0207540 A1 | 11/2003 | Ahn et al. | |
| 2003/0207593 A1 | 11/2003 | Derderian et al. | |
| 2003/0227033 A1 | 12/2003 | Ahn et al. | |
| 2004/0023461 A1 | 2/2004 | Ahn et al. | |
| 2004/0036129 A1 | 2/2004 | Forbes et al. | |
| 2004/0110348 A1 | 6/2004 | Ahn et al. | |
| 2004/0110391 A1 | 6/2004 | Ahn et al. | |
| 2004/0140513 A1 | 7/2004 | Forbes et al. | |
| 2004/0164357 A1 | 8/2004 | Ahn et al. | |
| 2004/0175882 A1 | 9/2004 | Ahn et al. | |
| 2004/0214399 A1 | 10/2004 | Ahn et al. | |
| 2004/0217410 A1 | 11/2004 | Shuang et al. | |
| 2004/0224527 A1 | 11/2004 | Sarigiannis et al. | |
| 2005/0006727 A1 | 1/2005 | Forbes et al. | |
| 2005/0007817 A1 | 1/2005 | Forbes et al. | |
| 2005/0017327 A1 | 1/2005 | Forbes et al. | |
| 2005/0023650 A1 | 2/2005 | Forbes et al. | |
| 2005/0030803 A1 | 2/2005 | Forbes et al. | |
| 2005/0062659 A1 | 3/2005 | Packer | |

OTHER PUBLICATIONS

Arnoldussen, Thomas C., "A Modular Transmission Line/Reluctance Head Model", *IEEE Transactions on Magnetics*, 24, (Nov. 1988), 2482-2484.

Bruckner, W., et al., "Oxidation of NiFe Thin Films", *Material Science and Engineering*, B, 86(3), (Oct. 3, 2001), 272-275.

Herman, Marian, "Atomic layer epitaxy—12 years later", *Vacuum*, vol. 42, No. 1-2, (1991), 61-66, no month.

Hsu, Yimin, et al., "High frequency high field permeability of patterned Ni80Fe20 and Ni45Fe55 thin films", *Journal of Applied Physics*, 89(11), (Jun. 1, 2001), 6808-6810.

Hsu, et al., "Low temperature fired NiCuZn ferrite", *IEEE Transactions on Magnetics*, 30 (6), (1994), 4875-4877, no month.

Johnson, H. W., et al., "High Speed Digital Design", *A Handbook of Black Magic*, Prentice Hall PTR, Upper Saddle River, New Jersey, (1993), pp. 422 & 426, no month.

Johnson, H., "In: High Speed Digital Designs: A Handbook of Black Magic", *Prentice-Hall. Inc., New Jersey, ISBN 0-13-395724-1*, (1993), 66-71, 194-197, no month.

Lee, K., et al., "Modeling and Analysis of Multichip Module Power Supply Planes", *IEEE Transactions on Components, Packaging, and Manufacturing Technology*, vol. 18, No. 4, (1995), pp. 628-639, no month.

Rabaey, J. M., *Digital Integrated Circuits, A Design Perspective*, Prentice Hall, Upper Saddle River, New Jersey, ISBN 0-13-178609-1, (1996), pp. 482-493, no month.

Ramo, S., "Fields and Waves in Communication Electronics", *John Wiley & Sons, Inc., New York, 3rd ed.*, (1994), pp. 428-433, no month.

Senda, M, "Permeability Measurement of Soft Magnetic Films at High Frequency and Multilayering Effect", *IEEE Translation Journal on Magnetics in Japan*, vol. 8, No. 3, (Mar. 1993), pp. 161-168.

Thomas, M., et al., "VLSI Multilevel Micro-Coaxial Interconnects for High Speed Devices", *IEEE International Electron Devices Meeting*, (1990), 55-58, no month.

Webb, Bucknell C., "High-frequency permeability of laminated and unlaminated, narrow, thin-film magnetic stripes (invited)", *Journal of Applied Physics*, (1991), 5611, 5613, 5615, no month.

Webb, Bucknell C., et al., "The high field, high frequency permeability of narrow, thin-film magnetic stripes", *IEEE Transactions of Magnetics*, vol. 27,(1991), pp. 4876-4878, no month.

Zhang, Hongguo, et al., "Investigation on Structure and Properties of Low-Temperature Sintered Composite Ferrites", *Materials Research Bulletin*, 35, (2000), 2207-2215, no month.

Zhenxing, Yue, et al., "Low-Temperature Sinterable Cordicrite Glass-ceramics", *High Technology Letters (China)*, 10 (115), (2000), 96-97, no month.

\* cited by examiner

HIGH PERMEABILITY LAYERED MAGNETIC FILMS TO REDUCE NOISE IN HIGH SPEED INTERCONNECTION

CROSS-REFERENCE TO RELATED APPLICATIONS

The present application is a continuation of U.S. application Ser. No. 10/443,021, filed May 22, 2003, now U.S. Pat. No. 6,970,053, which application is incorporated herein by reference in its entirety.

FIELD OF THE INVENTION

The present invention relates to the field of integrated circuits, and in particular to improved transmission lines for high speed interconnections.

BACKGROUND OF THE INVENTION

The metal lines over insulators and ground planes, metal lines buried in close proximity to dielectric insulators and used for integrated circuit interconnects, and interconnection lines on interposers and printed circuit boards are in reality transmission lines. The use of coaxial interconnections through the substrate in CMOS integrated circuits can also be considered transmission lines.

The low characteristic impedance of these interconnection lines results in part from the low characteristic impedance of free space, $Z_o = (\mu_o/\epsilon_o)^{1/2} = 377$ ohms, and in part from the dielectric material used for electrical insulation in the lines which has a higher dielectric permittivity than free space. Most commonly used coaxial lines have an impedance of 50 ohms or 75 ohms, as it is difficult to achieve larger values.

In the past these effects have not received much consideration in integrated circuits themselves since the signal propagation speed with oxide insulators is 15 cm/ns and switching speeds on integrated circuits the size of a centimeter have been slower than $\frac{1}{15}$ ns or 70 ps. Switching times in CMOS circuits have been limited by the ability to switch the capacitive loads of long lines and buffers, and charge these capacitances over large voltage swings to yield a voltage step signal. Transmission line effects become important only if the switching time is of the same order as the signal propagation time.

Previously, most CMOS integrated circuit interconnections relied on the transmission of a voltage step or signal from one location to another. The switching time response or signal delay where voltage signaling is used is generally slow if the transmission line is long. Further, if two transmission lines are in close proximity to one another, the voltage swing on one line can induce a large voltage swing or noise voltage on a neighboring transmission line.

Transmission line effects and techniques for improved transmission line interconnections are described in "Current Mode Signal Interconnects and CMOS Amplifier," Forbes et. al., U.S. Pat. No. 6,255,852, which is incorporated herein by reference. Specifically, techniques using current signaling over low impedance transmission lines, wherein the transmission lines are impedance matched, instead of voltage signaling are disclosed. Also, techniques allowing for a very fast interconnection signal response are disclosed. Additional techniques for improved methods and structures for transmission lines are disclosed in U.S. Pat. No. 6,373,740, Forbes, et al., titled "Transmission Lines for CMOS Integrated Circuits," which is incorporated herein by reference. Specifically, forming a transmission line between electrically conductive lines and conductive planes to reduce signal delay, skew and crosstalk is disclosed.

Inductive effects on interconnection lines that are more pertinent at high speeds are a function not only of the self inductance of the interconnection lines, L, but also the mutual inductance between interconnection lines, M. FIG. 1 illustrates two adjacent interconnection lines 101A, 101B with a mutual inductance, M, between the two lines, and the calculation of the voltage (V=M di/dt) induced on an adjacent line by magnetic coupling and mutual inductance.

A noise current will be induced in an adjacent line 101B in close proximity, s=1 µm, for the whole 0.1 cm length, l. In a system utilizing signal currents over low impedance transmission lines, the noise current will be a few percent of the signal current and the noise to signal ratio will become undesirable. Reduction of the noise current, however, is desirable.

In general, it can be shown that if the line is impedance matched, the signal to noise ratio due to inductive coupling is of the order $(L/M)(t_{rise}/t_{prop})$, where $t_{rise}$ is the rise time of the current waveform and $t_{prop}$ is the propagation time down the line. Therefore, techniques are needed which will minimize the mutual inductance between lines and improve the signal-to-noise ratio on high speed interconnection lines in integrated circuits.

BRIEF SUMMARY OF THE INVENTION

Embodiments of the invention address the problems described above and provide structures for magnetically shielded transmission lines for use with high speed integrated circuits having an improved signal to noise ratio, and methods for forming the same. At least one magnetic shield structure contains electrically induced magnetic fields generated around a number of transmission lines. The shield material is made of alternating layers of magnetic material and insulating material.

The at least one shield structure at least partially shields neighboring transmission lines from the magnetic fields generated around the respective transmission lines when they transmit an electrical signal. Thereby, mutual inductance between neighboring transmission lines is minimized and the signal to noise ratio is improved.

BRIEF DESCRIPTION OF THE DRAWINGS

The foregoing and other aspects of the invention will be better understood from the following detailed description of the invention, which is provided in connection with the accompanying drawings, in which.

DETAILED DESCRIPTION OF THE INVENTION

Figure 1:
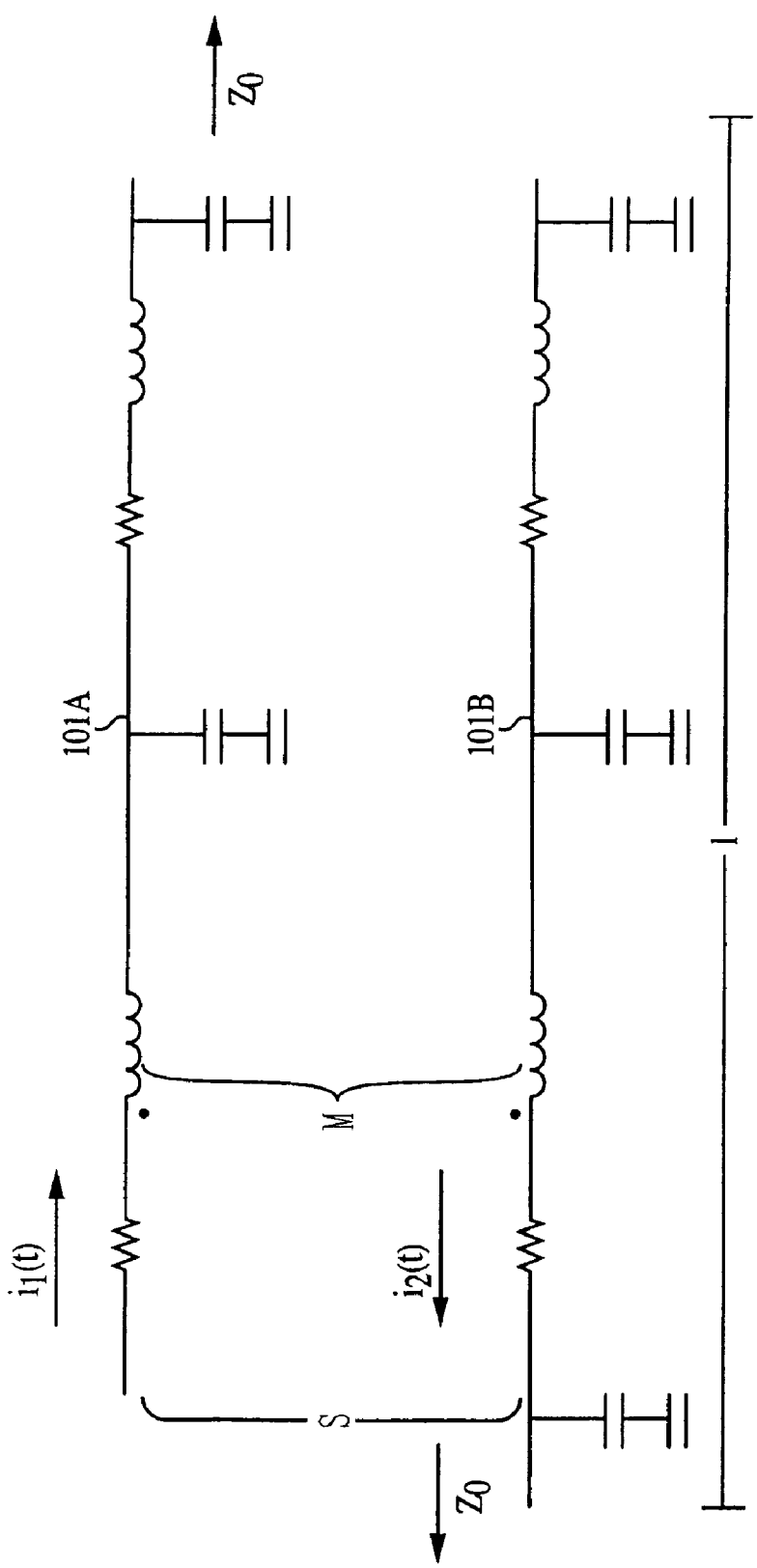
FIG. 1 is a schematic diagram illustrating mutual inductance between two conventional transmission lines.

In the following detailed description, reference is made to various specific embodiments of the invention and to the accompanying drawings, which form a part hereof, and which illustrate specific embodiments of the invention. In the drawings, like numerals describe substantially similar components throughout the several views. These embodiments are described with sufficient detail to enable those skilled in the art to practice the invention, and it is to be understood that other embodiments may be employed, and that structural, logical, and other changes may be made without departing from the scope of the invention.

The terms "wafer" and "substrate" are to be understood as including, among others, silicon, silicon-on-insulator (SOI), or silicon-on-sapphire (SOS) technology, doped and undoped semiconductors, epitaxial layers of silicon supported by a base semiconductor foundation, and other semiconductor structures. Furthermore, when reference is made to a "wafer" and "substrate" in the following description, previous process steps may have been utilized to form regions or junctions in the base semiconductor structure or foundation. In addition, the semiconductor need not be silicon-based, but could be based on silicon-germanium, germanium, or gallium-arsenide, as well as other semiconductor structures well known to one skilled in the art. The term "conductor" is understood to include semiconductors, and the term "insulator" is defined to include any material that is less electrically conductive than the materials referred to as conductors.

The term "transmission line(s)" is understood to include, but not be limited to, metal lines over insulators and ground planes, metal lines buried in close proximity to dielectric insulators and used for integrated circuit interconnects, coaxial interconnections through the substrate in CMOS integrated circuits, or interconnection lines on interposers or printed circuit boards.

The present invention is preferably used with very low impedance transmission lines, and where the capacitive coupling between lines is small. The following co-pending applications by the same inventors provide additional discussion of techniques for very low impedance transmission lines, and for minimizing the capacitive coupling between transmission lines: "High Permeability Composite Films to Reduce Noise in High Speed Interconnects," application Ser. No. 10/099,020; "High Permeability Layered Films to Reduce Noise in High Speed Interconnects," application Ser. No. 10/099,217; and "High Permeability Thin Films and Patterned Thin Films to Reduce Noise in High Speed Interconnects," application Ser. No. 10/099,218. The same are incorporated herein by reference. Also, U.S. Patent application Ser. No. 10/164,475, Forbes et al, titled "Novel Transmission Lines for CMOS Integrated Circuits," discusses techniques for improving high speed interconnections by minimizing interwire capacitance using grounded electrically conductive lines to contain an electrical field. The same is incorporated herein by reference.

Figure 2A:
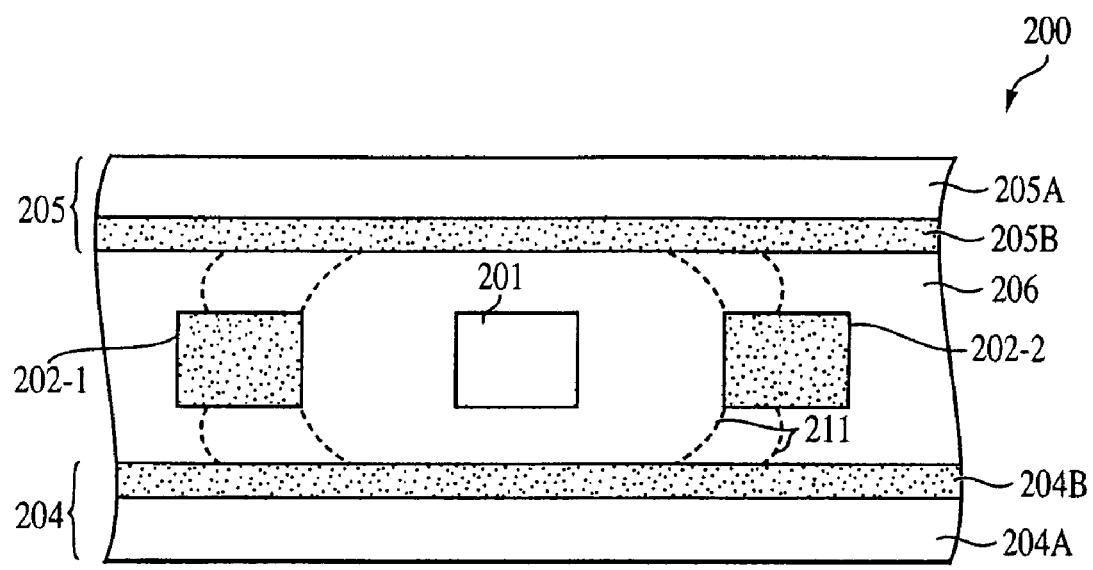
FIG. 2A illustrates a transmission line in accordance with a first exemplary embodiment of the invention.

FIG. 2A illustrates a transmission line in accordance with a first exemplary embodiment of the invention. As shown in FIG. 2A, the embodiment includes a pair of shield lines 202-1, 202-2 depicted on opposing sides of a transmission line 201. For simplicity only one transmission line 201 is illustrated, but the invention may include any number of transmission lines 201 between any number of shield lines 202-1, 202-2. Preferably, the transmission line 201 and the shield lines 202-1, 202-2 are spaced parallel to one another.

The transmission line 201 is spaced between a pair of sandwich layers 204 and 205. The sandwich layers 204, 205 each include a conductive plane 204A, 205A and a shield layer 204B, 205B. The transmission line 201 and the shield lines 202-1, 202-2 are separated from one another and from the pair of sandwich layers 204, 205 by an insulating material 206, which may be an oxide or other low k dielectric.

As is known in the art, an electrical signal transmitted via the transmission line 201 will induce a magnetic field surrounding the transmission line 201. Such a magnetic field is illustrated by magnetic field lines 211. According to the teachings of the present invention, the shield lines 202-1, 202-2 and the shield layers 204B, 205B provide magnetic shielding to reduce the amount of magnetically induced noise on neighboring transmission lines (not shown). In this embodiment the magnetic field is confined in the x and y directions.

Also, the conductive planes 204A, 205A of the sandwich layers 204 and 205 respectively, provide electric field confinement. The formation of the embodiment of FIG. 2A is described in connection with FIGS. 2B–2K.

Figure 2B:
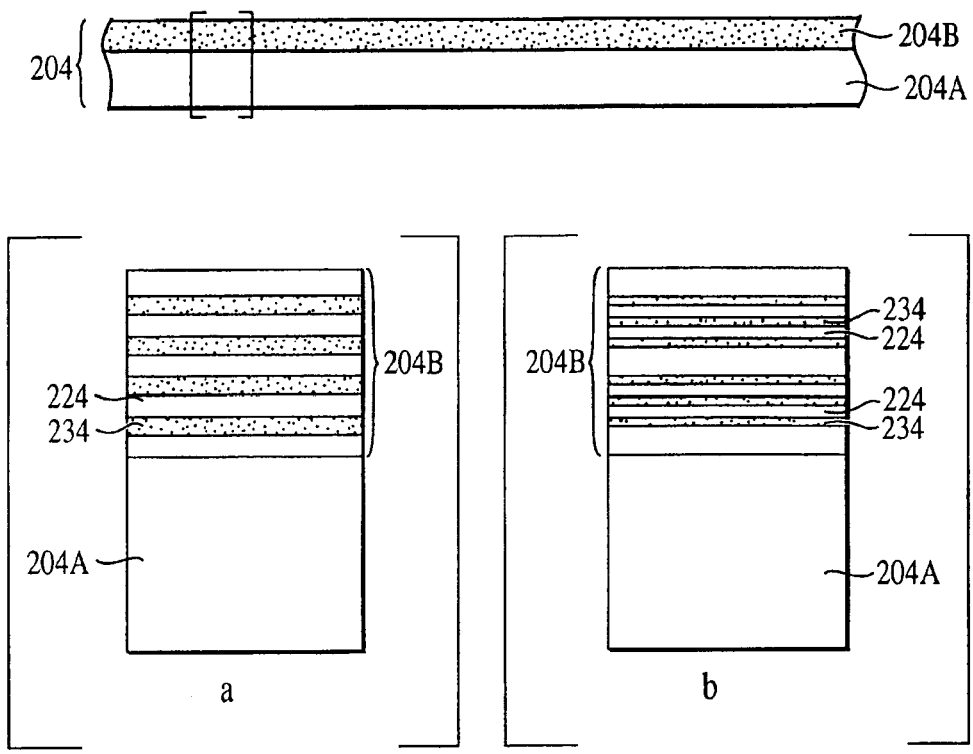
FIG. 2B illustrates the FIG. 2A embodiment at an initial fabrication stage.

FIG. 2B shows the initial steps of fabrication of the FIG. 2A structure 200. A first electrically conductive plane 204A is formed on a substrate (not shown) by depositing a layer of electrically conductive material using a technique such as evaporation, sputtering, or electroplating. The conductive plane may be formed of copper, aluminum, or any other suitable electrically conductive material. A shield layer 204B is formed on the first conductive plane 204A. Together, conductive plane 204A and shield layer 204B are referred to as a sandwich layer 204. The shield layer 204B is formed of shield material.

Figure 2C:
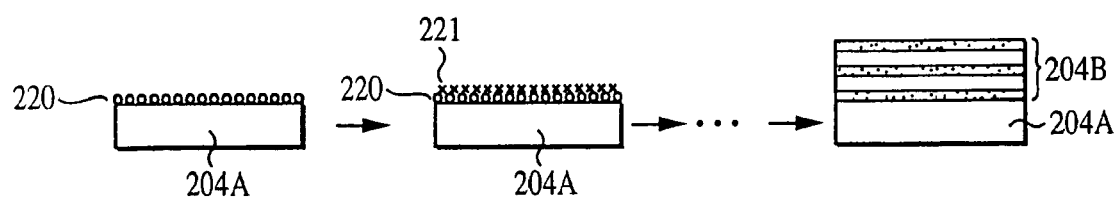
FIG. 2C illustrates the FIG. 2A embodiment at an intermediate fabrication stage.

As shown in FIGS. 2B and 2C, shield material is formed of films of a magnetic material 234 and an insulating material 224. The films of magnetic material 234 and insulating material 224 are alternated to form a desired layering pattern. The magnetic material 234 may be a composite magnetic material 234. In such a case, the magnetic material 234 is itself formed of layers of two or more materials that are alternated to form a desired layering pattern. The characteristics of multilayer films including non-magnetic materials, as well as magnetic materials, such as NiFe or Fe, have been shown to have higher effective permeabilities at higher frequencies than simple layers of magnetic materials by themselves. (See generally, M. Senda, "Permeability Measurement of Soft Magnetic Films at High Frequency and Multilayering Effect," IEEE Translation of J. Magnetics in Japan, Vol. 8, No. 3, pp. 161–168, March 1993).

Preferably, the magnetic material 234 is formed of alternating films of Ni and Fe, where the layering pattern is a repetitious Ni/Fe structure forming an NiFe film; and the insulating material 224 is $SiO_2$. The NiFe film is alternated with a film of $SiO_2$ in a repetitious NiFe/$SiO_2$ pattern to form a layer of shield material as shown in FIG. 2B, enlargement a. Each film of NiFe is approximately 50 nm thick, and each film of $SiO_2$ is approximately 100 nm thick. Further, the film of magnetic material 234 has a structure such that the Fe film does not contact the insulating material 224.

Also preferable, is an embodiment wherein the magnetic material 234 is Fe and the insulating material 224 is $SiO_2$. Films of Fe and films of $SiO_2$ are alternated to have a repetitious Fe/$SiO_2$ structure forming an Fe/$SiO_2$ film. The Fe/$SiO_2$ film is further alternated with a film of $SiO_2$ to have a repetitious (Fe/$SiO_2$)/$SiO_2$ structure forming a layer of shield material as shown in FIG. 2B, enlargement b. Preferably, the film of Fe in the Fe/$SiO_2$ film is approximately 7 nm thick, the film of $SiO_2$ in the Fe/$SiO_2$ film is approximately 2.5 nm thick, and the film of $SiO_2$ alternated with the Fe/$SiO_2$ film is approximately 50 nm thick.

Currently, these materials are deposited using sputtering or other similar conventional methods. These conventional methods present numerous problems. Sputtering results in low density of deposited magnetic films, and sintering methods need to be employed to improve the process. Sintering methods, however, have detrimental effects including mixing of the composite ferrites at temperatures above 300 to 400° C. This mixing leads to the degradation of the magnetic properties and oxidation of the ferrites.

It has been shown that NiFe thin films readily oxidize when annealed at temperatures of 400° C. in conventional air, and oxidation begins to occur at temperatures as low as 300° C. In a layering structure which also includes $SiO_2$, Fe is still oxidized, even when annealing occurs at very low pressures. Oxidation of Fe results in the formation of a metal oxide layer, typically $Fe_2O_3$, which can be as thick as 20 nm. This causes the concentration of Fe in the NiFe layer to decrease and leads to degradation in the properties of the layer.

Using conventional sputtering techniques, it is also difficult to achieve the small thicknesses that are desirable for multilayer films as integrated circuit size continues to scale down.

Physical Vapor Deposition (PVD) methods do allow for low temperature deposition, but produce poor step coverage in deep trenches and small geometries.

Instead of using these conventional techniques, the invention employs atomic layer deposition (ALD) as a means of effectively forming layers of shield material such that their magnetic properties are maintained. ALD is a process for growing semiconductor films based on stepwise formation of individual atomic layers on a substrate. ALD permits uniform film thickness; lower sintering temperatures, if any; effective step coverage; very low pinhole density, or higher density of the deposited films; and potential elimination of gas phase reactions. See M. Herman, "Atomic Layer Epitaxy—12 Years Later," Vacuum, Vol. 42, Nos. 1/2, pp. 61–66, 1991, which is incorporated herein by reference.

Referring to FIG. 2C, the shield layer 204B is formed by ALD. In the example where NiFe is the magnetic material 234 and $SiO_2$ is the insulating material 224, monolayers of Ni and Fe are alternatively deposited until the NiFe film reaches a desired thickness. FIG. 2C illustrates formation of a layer of shield material on the conductive plane 204A to Ni and Fe reactants. A monolayer 220 of Ni is deposited over the conductive plane 204A. A monolayer 221 of Fe is deposited over the monolayer 220 of Ni. Monolayers 220 and 221 of Ni and Fe respectively, are alternatively deposited until the NiFe film has reached a desired thickness. Preferably, a monolayer of Ni is on top to reduce the oxidation of Fe. Then, monolayers of $SiO_2$ are similarly deposited to a desired thickness. The ALD process is then repeated until the shield layer 204B has a desired thickness.

FIG. 2B, enlargement a, illustrates the layering structure of shield material where NiFe is the magnetic material 234 and $SiO_2$ is the insulating material 224. A number of NiFe films 234 are alternated with a number of $SiO_2$ films 224 to create a layer of shield material with a desired thickness, yielding an $NiFe/SiO_2$ structure. Enlargement b, FIG. 2B, illustrates an embodiment where the shield material has an $(Fe/SiO_2)/SiO_2$ structure.

In this, and in any of the embodiments described below, shield material is formed of alternating films of magnetic material 234 and insulating material 224 by ALD as described in connection with FIGS. 2B and 2C. Further, the shield material for this embodiment, and for the embodiments described below, preferably has an $NiFe/SiO_2$ or an $(Fe/SiO_2)/SiO_2$ structure as described in connection with FIGS. 2B and 2C. Therefore, the fabrication of structures formed of shield material will be described more generally henceforth.

Figure 2D:
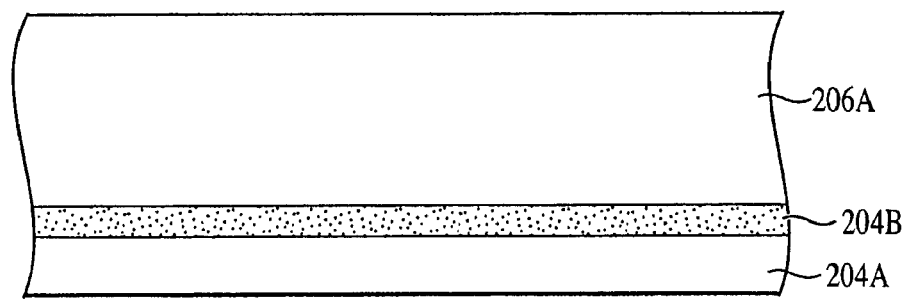
FIG. 2D illustrates the FIG. 2A embodiment at an intermediate fabrication stage.
Figure 2E:
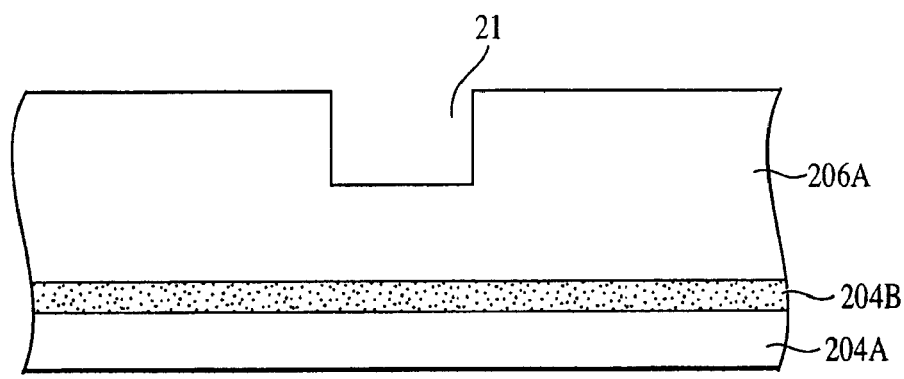
FIG. 2E illustrates the FIG. 2A embodiment at an intermediate fabrication stage.
Figure 2F:
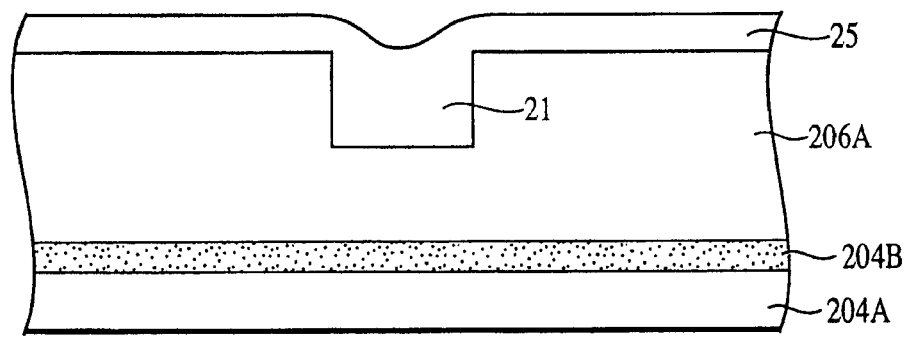
FIG. 2F illustrates the FIG. 2A embodiment at an intermediate fabrication stage.

Referring to FIG. 2D, a first insulating layer 206A is formed over the shield layer 204B. The insulating layer 206A may be an oxide or other low k dielectric and may be formed by conventional methods, such as chemical vapor deposition (CVD). FIG. 2E depicts an opening 21 formed by conventional techniques in insulating layer 206A where a transmission line 201 (FIG. 2A) is to be formed. FIG. 2F depicts a layer 25 of electrically conductive material deposited over the insulating layer 206A filling opening 21. The electrically conductive layer 25 may be formed by conventional techniques such as evaporation, sputtering, or electroplating. The electrically conductive layer 25 may be formed of copper, aluminum, or any other suitable electrically conductive material.

Figure 2G:
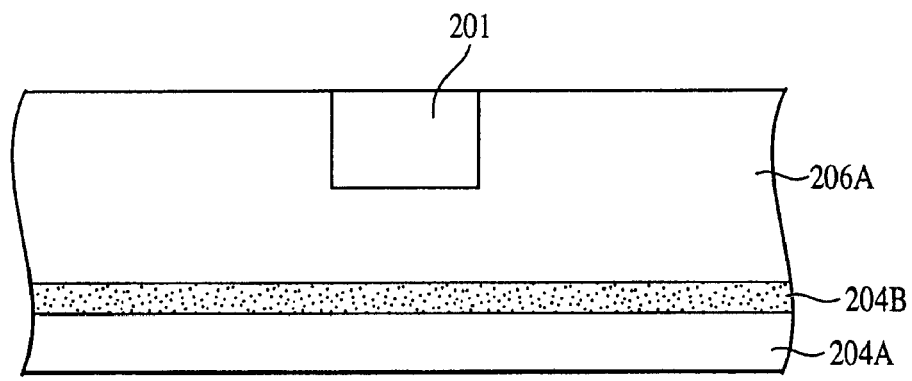
FIG. 2G illustrates the FIG. 2A embodiment at an intermediate fabrication stage.
Figure 2H:
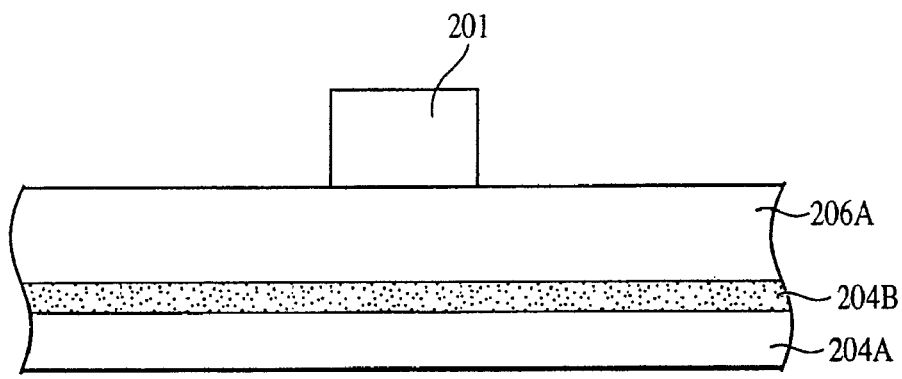
FIG. 2H illustrates the FIG. 2A embodiment at an intermediate fabrication stage.

FIG. 2G depicts removal of the excess conductive material leaving only the portion of the conductive material filling opening 21 (FIG. 2E) to form a transmission line 201. The excess conductive material may be removed by conducting a chemical mechanical polish (CMP) step. FIG. 2H depicts performance of an etchback step to remove a portion of the first insulating layer 206A from the sides of transmission line 201, fully exposing both lateral sides of transmission line 201.

Alternatively, transmission line 201 may be formed over the first insulating layer 206A using optical lithography followed by an additive metallization, such as lift-off evaporation or electroplating to achieve the structure illustrated in FIG. 2H.

Figure 2I:
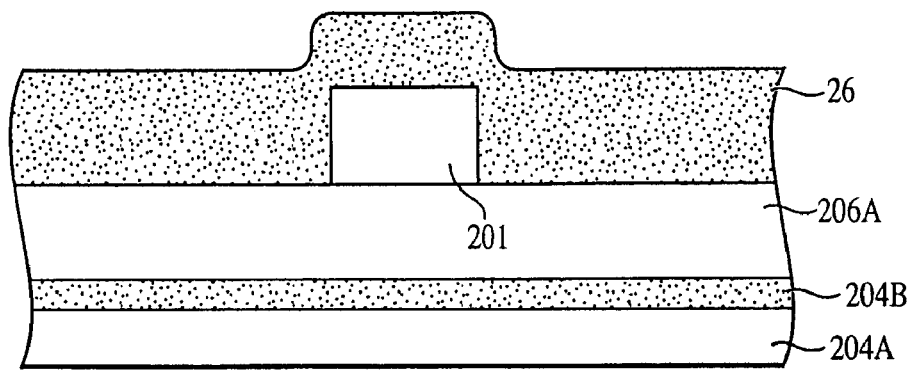
FIG. 2I illustrates the FIG. 2A embodiment at an intermediate fabrication stage.
Figure 2J:
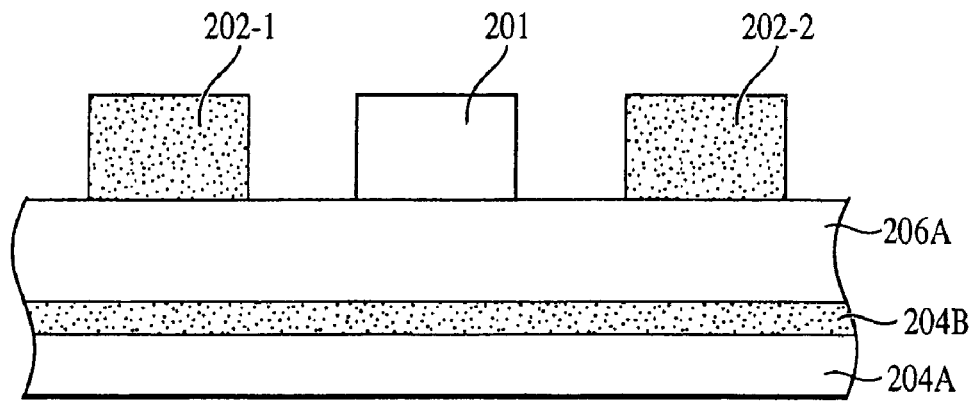
FIG. 2J illustrates the FIG. 2A embodiment at an intermediate fabrication stage.

As shown in FIG. 2I, a layer of shield material 26 is formed over first insulating layer 206A and transmission line 201. It is again noted that the layer of shield material 26 is formed by ALD as described above in connection with FIGS. 2B and 2C. As illustrated in FIG. 2J, the shield material is patterned and excess shield material is removed to form shield lines 202-1, 202-2 on opposing sides of transmission line 201.

Figure 2K:
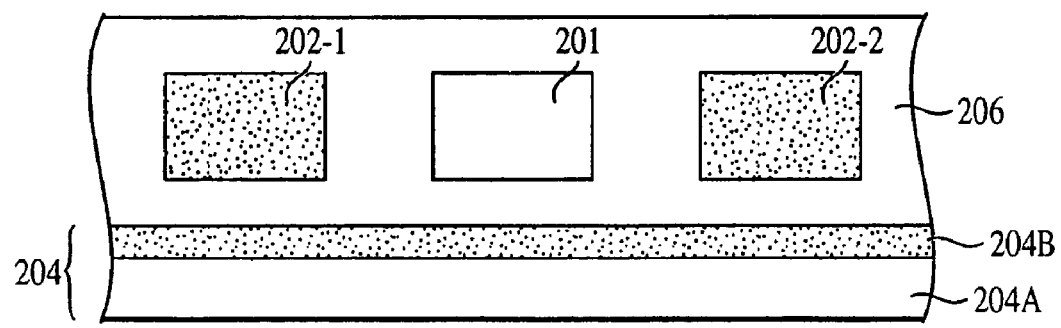
FIG. 2K illustrates the FIG. 2A embodiment at an intermediate fabrication stage.

FIG. 2K depicts a second layer of insulating material is formed over the first layer of insulating material 206A, the transmission line 201, and the pair of shield lines 202-1, 202-2, to form a single insulating layer 206. Insulating layer 206 is over sandwich layer 204 and surrounds the transmission line 201, and the pair of shield lines 202-1, 202-2. Finally, a second sandwich layer 205 is formed over insulating layer 206 similar to the sandwich layer 204 described in connection with FIGS. 2B and 2C. A shield layer 205B is formed over insulating layer 206, followed by the formation of a conductive plane 205A to achieve the structure 200 depicted in FIG. 2A.

As shown in FIG. 2A, and the figures illustrating other embodiments below, the shield layers 204B and 205B of sandwich layers 204 and 205 respectively, are formed on the inside of the conductive planes 204A and 205A adjacent to the transmission line 201. The shield layers 204B and 205B, however, may also be formed on the outside of the conductive planes 204A and 205A. In such case, the conductive plane 204A would be formed over shield layer 204B and shield layer 205B would be formed over conductive plane 205A. Similar modifications may be made to the other embodiments described herein.

Alternatively, the embodiment shown in FIG. 2A may be formed without shield layers 204B and 205B. In such a case, a first insulating layer 206A would be formed over conductive plane 204A and conductive plane 205A would be formed directly over insulating layer 206.

Figure 3A:
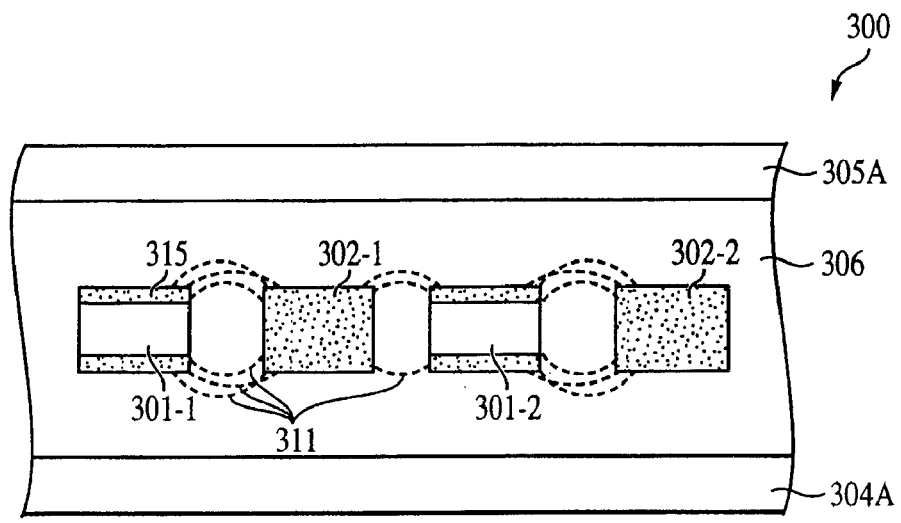
FIG. 3A illustrates neighboring transmission lines in accordance with a second exemplary embodiment of the invention.

FIG. 3A illustrates neighboring transmission lines in accordance with a second exemplary embodiment of the invention. A number of transmission lines, 301-1, 301-2 are interspaced between a number of shield lines 302-1, 302-2. For simplicity a pair of transmission lines 301-1, 301-2 are shown between a pair of shield lines 302-1, 302-2, but the invention has application to any number of transmission lines between any number of shield lines. Preferably, the transmission lines 301-1, 301-2 and the shield lines 302-1, 302-2 are spaced parallel to one another.

The transmission lines 301-1, 301-2 are spaced between a pair of conductive planes 304A and 305A. The transmission lines 301-1, 301-2 and the shield lines 302-1, 302-2 are separated from one another and from the pair of conductive planes 304A and 305A by an insulating layer 306, which may be an oxide. Further, in this embodiment, the transmission lines 301-1, 301-2 include shield layers 315 formed on a number of surfaces thereon. Preferably, as shown in FIG. 3A, the shield layers 315 are formed on two surfaces of the transmission lines 301-1, 301-2 including opposing sides adjacent to the conductive planes 304A, 305A.

An electrical signal transmitted via the transmission lines 301-1, 301-2 will induce a magnetic field surrounding the transmission lines 301-1, 301-2. Such a magnetic field is illustrated by magnetic field lines 311. According to the teachings of the present invention, the shield layers 315, formed on a number of surfaces of the transmission lines 301-1, 301-2, and the shield lines 302-1, 302-2 provide magnetic shielding to reduce the amount of magnetically induced noise on neighboring transmission lines, e.g. 301-1 and 301-2. The magnetic field lines 311 illustrate this magnetic shielding effect. This embodiment provides for magnetic confinement in all directions.

Also, the conductive planes 304A, 305A provide electric field confinement. Formation of the FIG. 3A structure 300 is illustrated by FIGS. 3B–3J.

Figure 3B:
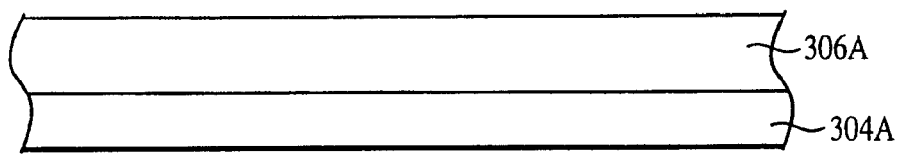
FIG. 3B illustrates the FIG. 3A embodiment at an initial fabrication stage.

Referring to FIG. 3B, a first conductive plane 304A is formed on a substrate (not shown) by depositing a layer of electrically conductive material using a technique such as evaporation, sputtering, or electroplating. The layer of electrically conductive material may be a layer of copper, aluminum, or any other suitable electrically conductive material. A first insulating layer 306A is formed on the conductive plane 304A, by conventional methods, such as CVD.

Figure 3C:
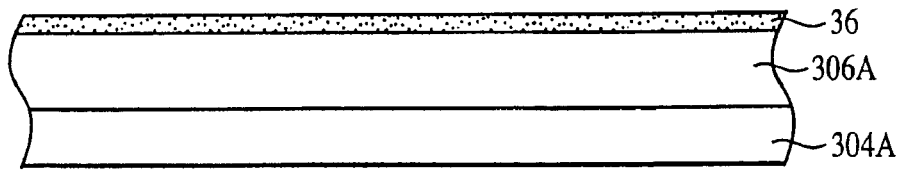
FIG. 3C illustrates the FIG. 3A embodiment at an intermediate fabrication stage.
Figure 3D:
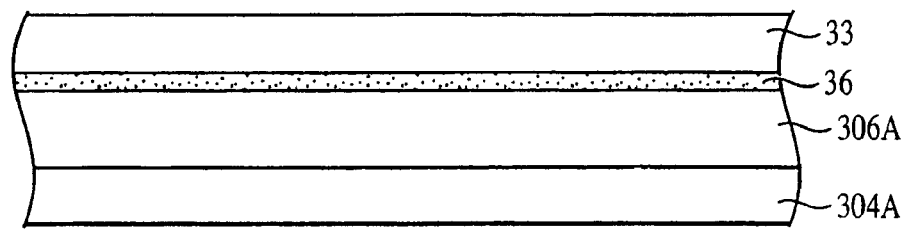
FIG. 3D illustrates the FIG. 3A embodiment at an intermediate fabrication stage.
Figure 3E:
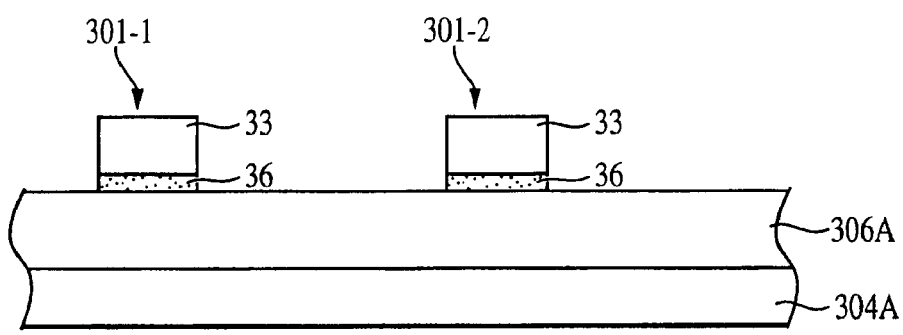
FIG. 3E illustrates the FIG. 3A embodiment at an intermediate fabrication stage.

FIG. 3C depicts a first layer of shield material 36 formed over the insulating layer 306A by ALD. The first layer of shield material 36 is formed as described above in connection with FIGS. 2B–C. FIG. 3D depicts a layer of electrically conductive material 33 formed over the first layer of shield material 36. The layer of electrically conductive material 33 may be formed using a technique such as evaporation, sputtering, or electroplating a layer of copper, aluminum, or any other suitable electrically conductive material. FIG. 3E depicts the removal of the excess shield material and electrically conductive material by conventional techniques, leaving partially formed transmission lines 301-1, 301-2 having a layer of electrically conductive material 33 over a first layer of shield material 36. The first layer of shield material 36 forms shield layers 315 (FIG. 3A) on a bottom surface of the transmission lines 301-1, 302-1.

Figure 3F:
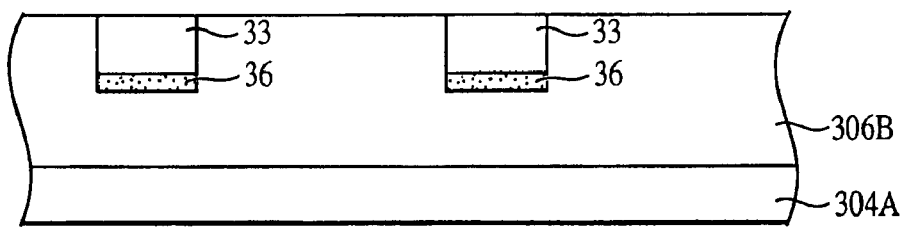
FIG. 3F illustrates the FIG. 3A embodiment at an intermediate fabrication stage.
Figure 3G:
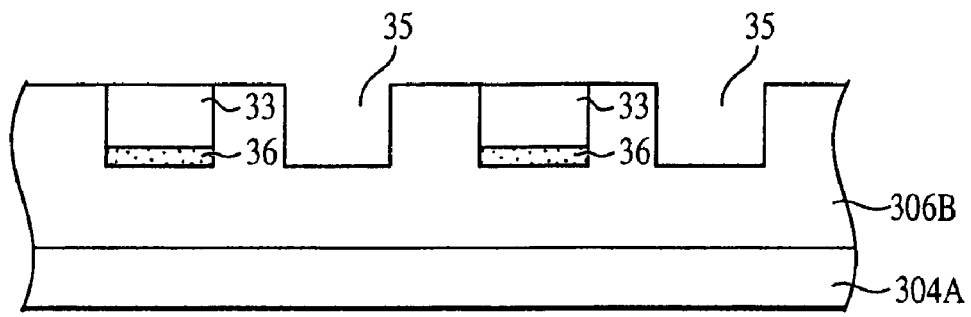
FIG. 3G illustrates the FIG. 3A embodiment at an intermediate fabrication stage.
Figure 3H:
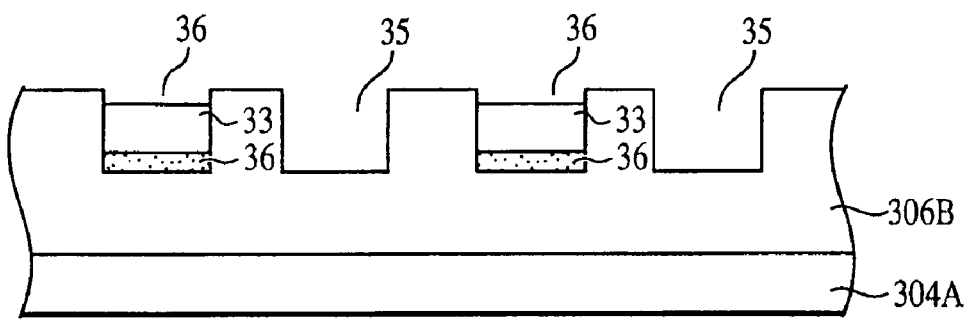
FIG. 3H illustrates the FIG. 3A embodiment at an intermediate fabrication stage.

Referring to FIG. 3F, a second layer of insulating material 306B is then formed over the first layer of insulating material 306A (FIG. 3E) and over the partially formed transmission lines 301-1, 301-2 to form a single insulating layer 306B. FIG. 3F depicts results of a first CMP step to expose the conductive layer 33 of the partially formed transmission lines 301-1, 301-2. FIG. 3G depicts the insulating layer 306B patterned to form openings 35 for the formation of shield lines 302-1, 302-2. Preferably, openings 35 are formed between and parallel to the partially formed transmission lines 301-1, 301-2. FIG. 3H depicts the results of an etchback step to partially remove a portion of conductive layer 33 forming openings 36, which are sufficient to form shield layers 315 on a top surface of the transmission lines 301-1, 301-2.

Figure 3I:
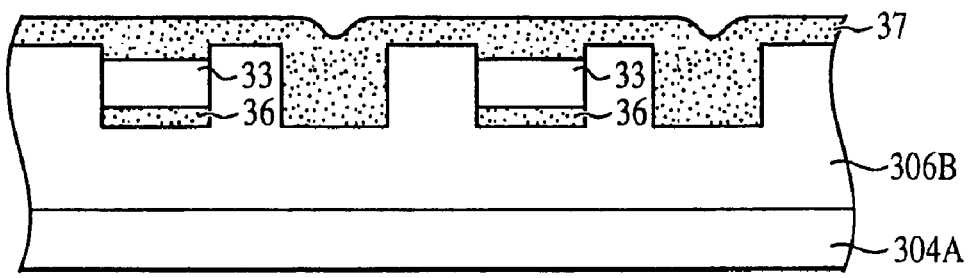
FIG. 3I illustrates the FIG. 3A embodiment at an intermediate fabrication stage.

As illustrated in FIG. 3I, a second layer of shield material 37 is then formed by ALD over the insulating layer 306B and over the partially formed transmission lines 301-1 and 301-2 filling openings 35 and 36. The second layer of shield material 37 is formed in the manner described above in connection with FIGS. 2B–2C. A second CMP step is performed (FIG. 3J) to remove excess shield material and expose the surface of insulating layer 306B. The shield material filling openings 35 forms the shield lines 302-1, 302-2. The shield material filling openings 36 forms the shield layers 315 on a top surface of transmission lines 301-1, 301-2.

A third layer of insulating material is formed over the second insulating layer 306B, the transmission lines 301-1, 301-2, and the shield lines 302-1, 302-2 to create a single insulating layer 306. Finally, a second conductive plane 305A is formed over the insulating layer 306 to achieve the structure 300 shown in FIG. 3A.

In this embodiment, forming the pair of conductive planes 304A and 305A is optional, and conductive planes 304A and 305A may be omitted.

Figure 4A:
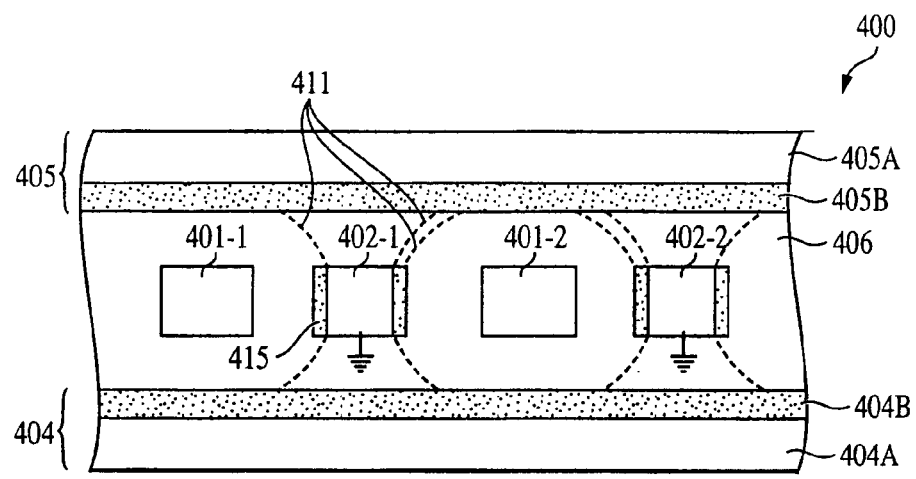
FIG. 4A illustrates neighboring transmission lines in accordance with a third exemplary embodiment of the invention.

FIG. 4A illustrates neighboring transmission lines in accordance with a third exemplary embodiment of the invention. A number of transmission lines 401-1, 401-2 are spaced between a number of electrically conductive lines 402-1, 402-2, which are grounded. For simplicity, a pair of transmission lines 401-1, 401-2 and a pair of electrically conductive lines 402-1, 402-2 are shown, but the invention has applicability to any number of transmission lines spaced between any number of electrically conductive lines. Preferably, the transmission lines 401-1, 401-2 and the electrically conductive lines 402-1, 402-2 are spaced parallel to one another.

The transmission lines 401-1, 401-2 are spaced between a pair of sandwich layers 404 and 405. Further, in this embodiment, the electrically conductive lines 401-1, 401-2, include shield layers 415 formed on a number of surfaces thereon. Preferably, as shown in FIG. 4A, the shield layers 415 are formed on two surfaces of the conductive lines 401-1, 401-2, including opposing sides adjacent to the transmission lines 401-1, 401-2.

An electrical signal transmitted via the transmission lines 401-1, 401-2 will induce a magnetic field surrounding the transmission lines 401-1, 401-2. Such a magnetic field is illustrated by magnetic field lines 411. According to the teachings of the present invention, the shield layers 415 on the electrically conductive lines 402-1, 402-2 and the shield layers 404B, 405B of the sandwich layers 404, 405 respectively, provide magnetic shielding to reduce the amount of magnetically induced noise on neighboring transmission lines, e.g. 401-1 and 401-2. The magnetic field lines 411 illustrate this magnetic shielding effect.

Also, the conductive planes 404A, 405A of the sandwich layers 404, 405 respectively, and the electrically conductive lines 402-1, 402-2 provide electric field confinement. In the embodiment of FIG. 4A, both the electric and magnetic fields are confined in the x and y directions. The formation of the FIG. 4A structure 400 will be described in connection with FIGS. 4B–4E.

Figure 4B:
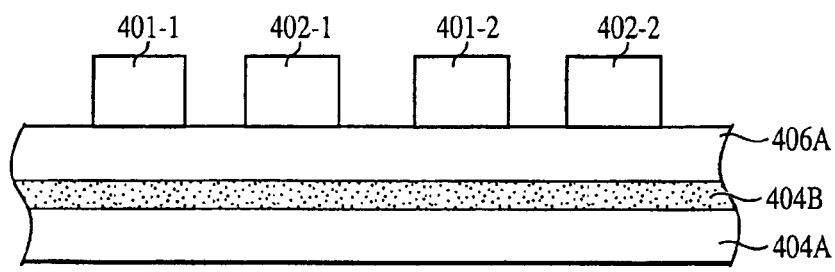
FIG. 4B illustrates the FIG. 4A embodiment at an intermediate fabrication stage.

Referring to FIG. 4B, a first insulating layer 406A is formed over a sandwich layer 404, as described in connection with FIGS. 2B–2D above. Then, transmission lines 401-1, 401-2 and electrically conductive lines 402-1, 402-2 are formed of an electrically conductive material over the insulating layer 406A by conventional methods, such as optical lithography followed by an additive metallization, such as lift-off evaporation or electroplating. The transmission lines 401-1, 401-2 and the electrically conductive lines 402-1, 402-2 may be formed of copper, aluminum, or any other suitable electrically conductive material. The transmission lines 401-1, 401-2 may transmit a signal, whereas the electrically conductive lines 402-1, 402-2 are grounded (FIG. 4A) and do not transmit a signal.

Figure 4C:
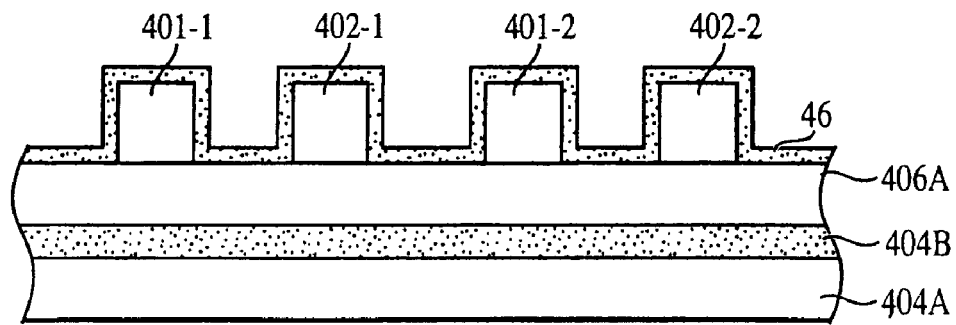
FIG. 4C illustrates the FIG. 4A embodiment at an intermediate fabrication stage.
Figure 4D:
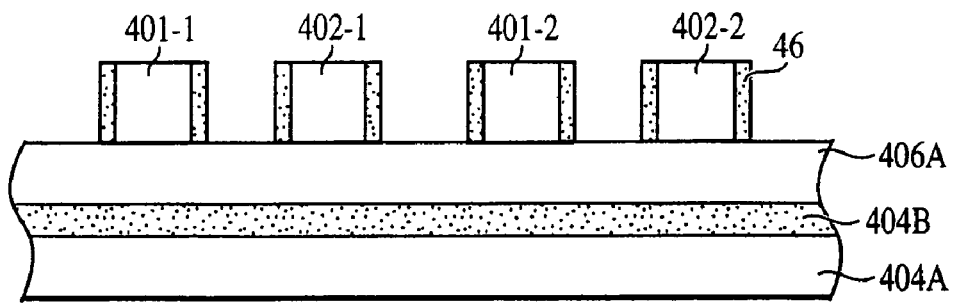
FIG. 4D illustrates the FIG. 4A embodiment at an intermediate fabrication stage.
Figure 4E:
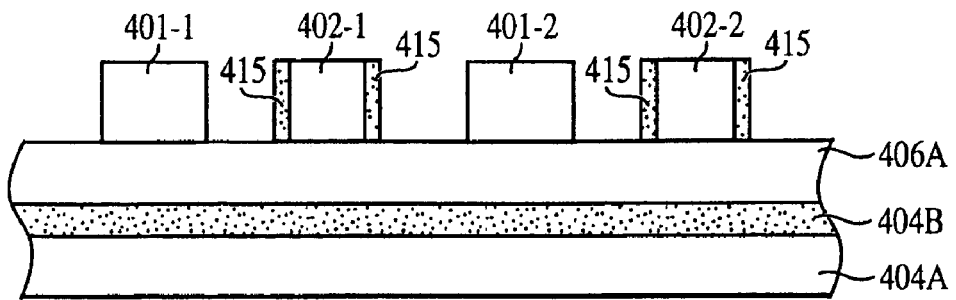
FIG. 4E illustrates the FIG. 4A embodiment at an intermediate fabrication stage.

Referring to FIG. 4C, a layer of shield material 46 is formed over the transmission lines 401-1, 401-2, the electrically conductive lines 402-1, 402-2, and the insulating layer 406A. A facet etch step is conducted to remove the shield material from the surfaces of the transmission lines 401-1, 401-2, the electrically conductive lines 402-1, 402-2, and the insulating layer 406A. Shield material remains on lateral sides of the transmission lines 401-1, 401-2 and electrically conductive lines 402-1, 402-2, as shown in FIG. 4D. FIG. 4E depicts the removal of excess shield material on transmission lines 401-1 and 401-2 by known techniques.

The structure 400 is completed as described above in connection with FIG. 2K. A second insulating layer 406 is formed over the transmission lines 401-1, 401-2, the electrically conductive lines 402-1, 402-2, and the first insulating layer 406A, to form a single insulating layer 406; and a sandwich layer 405 is formed over the insulating layer 406. Thereby, the structure 400 of FIG. 4A is achieved.

Figure 5A:
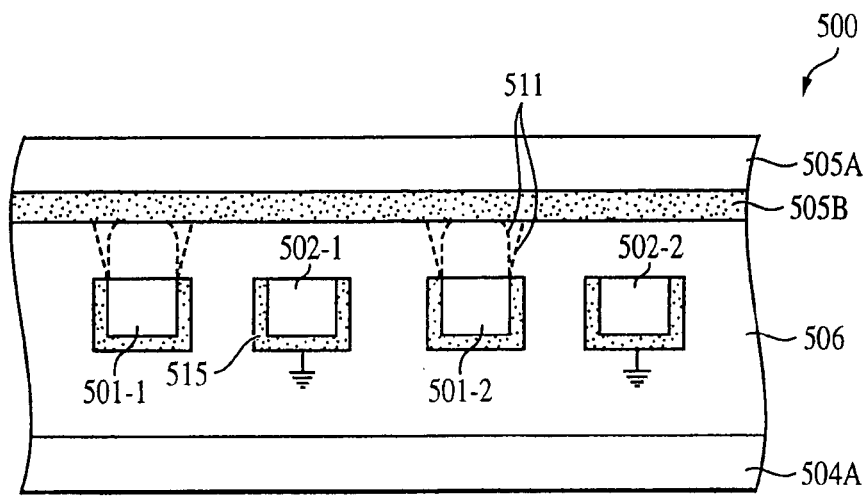
FIG. 5A illustrates neighboring transmission lines in accordance with a fourth exemplary embodiment of the invention.

FIG. 5A illustrates neighboring transmission lines in accordance with a fourth exemplary embodiment of the invention. A number of transmission lines 501-1, 501-2 are spaced between a number of electrically conductive lines 502-1, 502-2, which are grounded. For simplicity, a pair of transmission lines 501-1, 501-2 and a pair of electrically conductive lines 502-1, 502-2 are shown, but the invention has applicability to any number of transmission lines spaced between any number of electrically conductive lines. Preferably, the transmission lines 501-1, 501-2 and the electrically conductive lines 502-1, 502-2, are spaced parallel to one another.

The transmission lines 501-1, 501-2 are spaced between a conductive plane 504A and a sandwich layer 505. Further, in this embodiment, the transmission lines 501-1, 501-2 and the electrically conductive lines 502-1, 502-2 include shield layers 515 formed on a number of surfaces thereon. Preferably, shield layers 515 are formed on three surfaces of the transmission lines 501-1, 501-2 and the electrically conductive lines 502-1, 502-2. The three surfaces include opposing sides adjacent to the neighboring electrically conductive lines 502-1, 502-2 or transmission lines 501-1, 501-2 respectively, and on a side adjacent to the conductive plane 504A.

An electrical signal transmitted via the transmission lines 501-1, 501-2 will induce a magnetic field surrounding the transmission lines 501-1, 501-2. In the embodiment of FIG. 5A, such a magnetic field is illustrated by magnetic field lines 511. According to the teachings of the present invention, the shield layers 515 formed on a number of surfaces of the transmission lines 501-1, 501-2 and the electrically conductive lines 502-1, 502-2, and the shield layer 505B of sandwich layer 505, provide magnetic shielding to reduce the amount of magnetically induced noise on neighboring transmission lines, e.g. 501-1 and 501-2. The magnetic field lines 511 illustrate this magnetic shielding effect.

Also, conductive planes 504A, 505A and the electrically conductive lines 502-1, 502-2 provide electric field confinement. The formation of the FIG. 5A structure 500 will be described in connection with FIGS. 5B–5E.

Figure 5B:
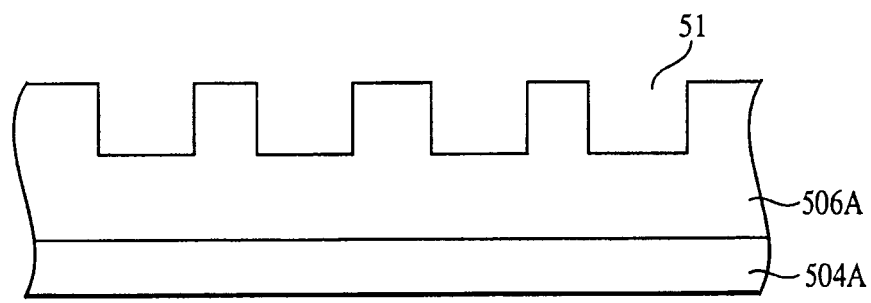
FIG. 5B illustrates the FIG. 5A embodiment at an intermediate fabrication stage.

Referring to FIG. 5B, a first insulating layer 506A having openings 51 for the formation of transmission lines and electrically conductive lines is formed over a conductive plane 504A. The formation of the structure illustrated in FIG. 5B is conducted similarly to that described in connection with FIGS. 2B–2E, except that the formation of a shield layer over the conductive plane 504A is omitted.

Figure 5C:
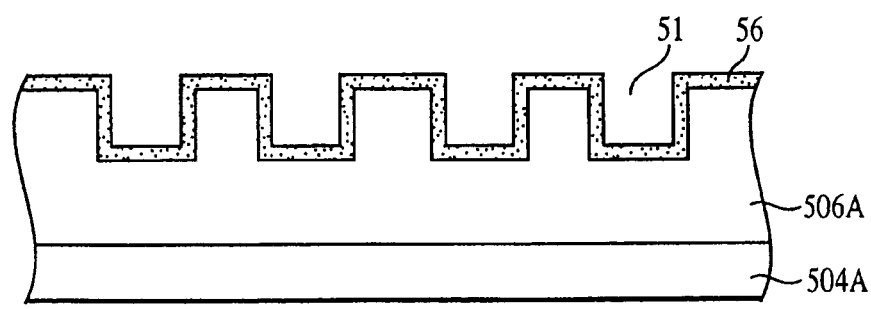
FIG. 5C illustrates the FIG. 5A embodiment at an intermediate fabrication stage.
Figure 5D:
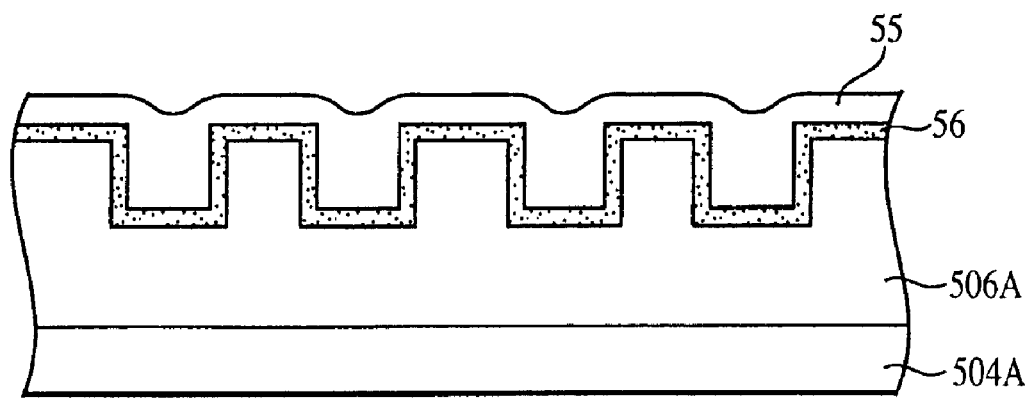
FIG. 5D illustrates the FIG. 5A embodiment at an intermediate fabrication stage.
Figure 5E:
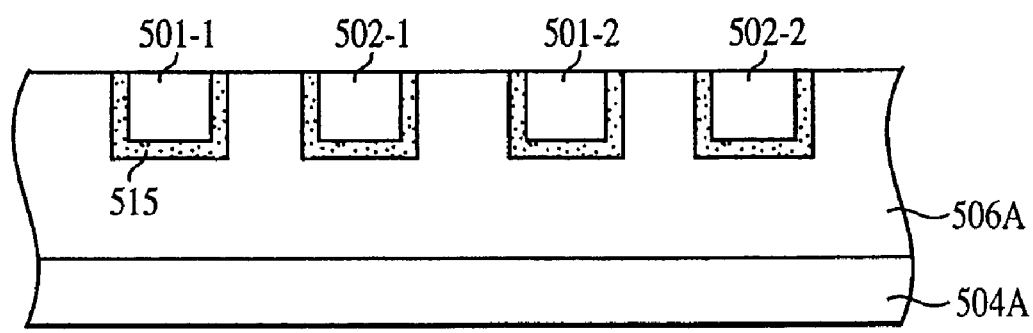
FIG. 5E illustrates the FIG. 5A embodiment at an intermediate fabrication stage.

Referring to FIG. 5C, a layer of shield material 56 is formed by ALD over the first insulating layer 506A and on the sides and bottoms of openings 51 to a desired thickness, but not filling openings 51. The layer of shield material 56 on the sides and bottoms of openings 51 will form the shield layers 515 on the three surfaces of the transmission lines 501-1, 501-2 and the electrically conductive lines 502-1, 502-2. FIG. 5D depicts a layer of electrically conductive material 55 formed over the shield layer 56 filling the openings 51. The layer of electrically conductive material 55 may be formed by evaporation, sputtering, or electroplating, and may be a layer of copper, aluminum, or any other suitable electrically conductive material. FIG. 5E depicts the results of a CMP step to remove excess conductive material and excess shield material, leaving transmission lines 501-1, 502-1 and electrically conductive lines 502-1, 502-2, both having shield layers 515 formed on three sides thereof.

Figure 3J:
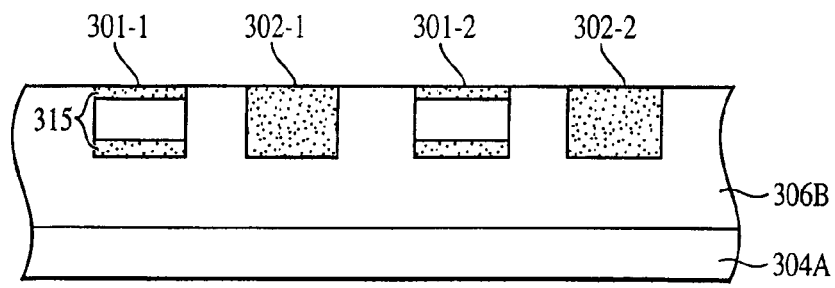
FIG. 3J illustrates the FIG. 3A embodiment at an intermediate fabrication stage.

The structure 500 of the embodiment shown in FIG. 5A may then be completed as described in connection with FIG. 3J, except that a sandwich layer 505 is formed over the insulating layer 506. Otherwise stated, a shield layer 505B is formed between the insulating layer 506 and the conductive plane 505A. Thereby, the structure 500 shown in FIG. 5A is achieved.

Figure 6A:
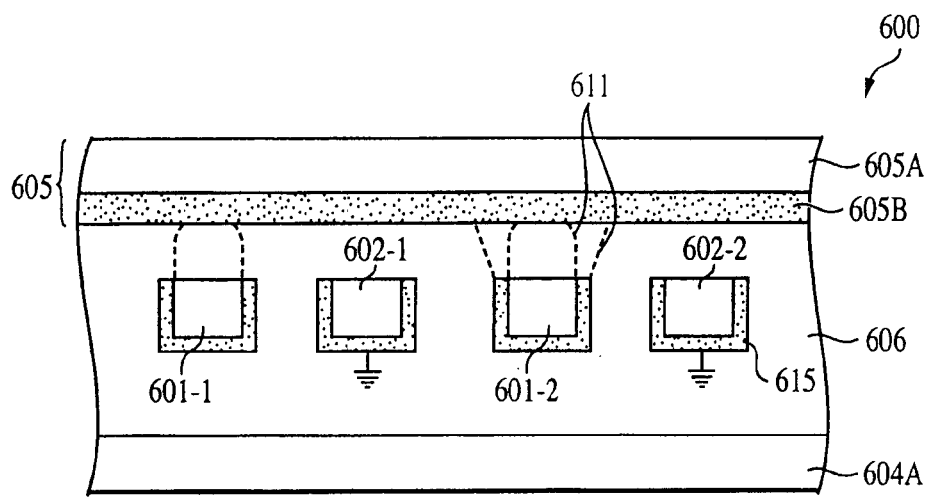
FIG. 6A illustrates neighboring transmission lines in accordance with a fifth embodiment of the invention.
Figure 7:
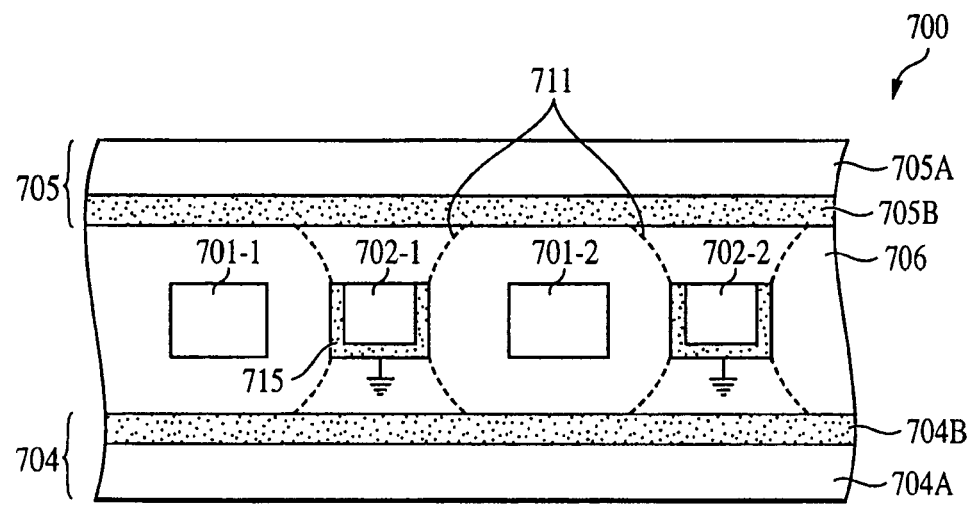
FIG. 7 illustrates neighboring transmission lines in accordance with a sixth exemplary embodiment of the invention.

FIG. 5A illustrates an embodiment that is easy to manufacture. FIG. 6A shows a very similar alternate configuration to that shown in FIG. 5A. In the embodiment illustrated in FIG. 6A, as described in more detail below, the number of transmission lines 601-1, 601-2 do not have shield layers formed thereon. FIG. 7 depicts another very similar alternate configuration. In the embodiment illustrated in FIG. 7, as described in more detail below, the electrically conductive lines 602-1, 602-2 do not have shield layers formed thereon.

FIG. 6A illustrates neighboring transmission lines in accordance with a fifth embodiment of the invention. A number of transmission lines 601-1, 601-2 are spaced between a number of electrically conductive lines 602-1, 602-2, which are shown grounded. For simplicity, a pair of transmission lines 601-1, 601-2 and a pair of electrically conductive lines 602-1, 602-2 are shown, but the invention has applicability to any number of transmission lines spaced between any number of electrically conductive lines. Preferably, the transmission lines 601-1, 601-2 and the electrically conductive lines 602-1, 602-2 are spaced parallel to one another.

The transmission lines 601-1, 601-2 are spaced between a conductive plane 604A and a sandwich layer 605. Further, in this embodiment, the transmission lines 601-1, 601-2 include shield layers 615 formed on a number of surfaces thereon. Preferably, shield layers 615 are formed on three surfaces of the transmission lines 601-1, 601-2, including opposing sides adjacent to the electrically conductive lines 602-1, 602-2, and on a side adjacent to the conductive plane 604A.

An electrical signal transmitted via the transmission lines 601-1, 601-2 will induce a magnetic field surrounding the transmission lines 601-1, 601-2. In the embodiment of FIG. 6A, such a magnetic field is illustrated by magnetic field lines 611. The shield layers 615 on the transmission lines 601-1, 601-2 and the shield layer 605B of sandwich layer 605, provide magnetic shielding to reduce the amount of magnetically induced noise on neighboring transmission lines, e.g. 601-1 and 601-2. The magnetic field lines 611 illustrate this magnetic shielding effect.

Also, the conductive planes 604A, 605A and the number of electrically conductive lines 602-1, 602-2 provide electric field confinement. The formation of the FIG. 6A structure 600 is described in connection with FIGS. 6B–6E.

Figure 6B:
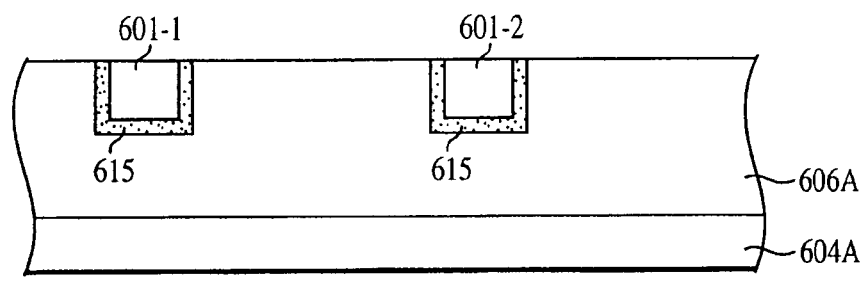
FIG. 6B illustrates the FIG. 6A embodiment at an intermediate fabrication stage.

Referring to FIG. 6B, there is a conductive plane 604A below a first layer of insulating material 606A. The transmission lines 601-1, 601-2 are formed having shield layers 615 on lateral sides thereof and on a side thereof adjacent to the conductive plane 604A. The structure illustrated in FIG. 6B is formed similarly to that of the structure illustrated in FIG. 5E, except that only transmission lines 601-1, 601-2 are formed.

Figure 6C:
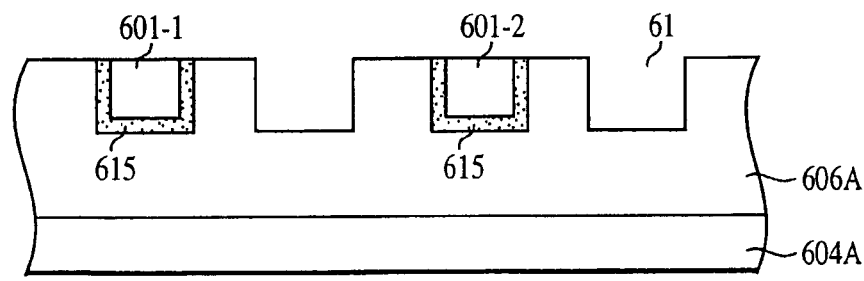
FIG. 6C illustrates the FIG. 6A embodiment at an intermediate fabrication stage.
Figure 6D:
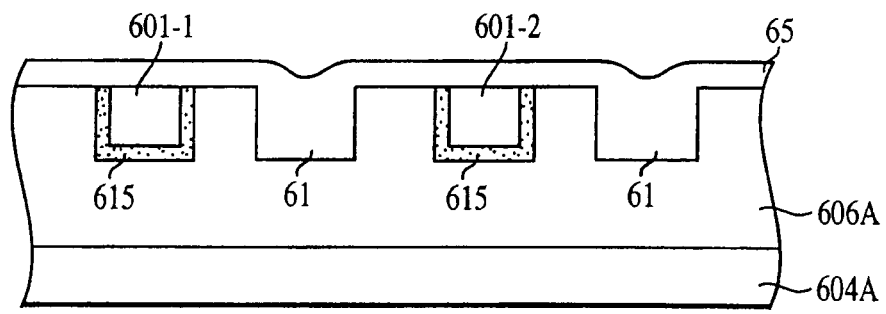
FIG. 6D illustrates the FIG. 6A embodiment at an intermediate fabrication stage.
Figure 6E:
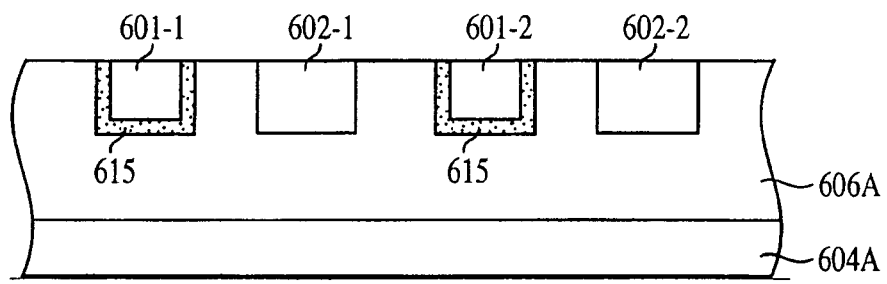
FIG. 6E illustrates the FIG. 6A embodiment at an intermediate fabrication stage.

Referring to FIG. 6C, openings 61 are formed in the insulating layer 606A where electrically conductive lines 602-1, 602-2 are to be formed. FIG. 6D depicts a layer of electrically conductive material deposited over the transmission lines 601-1, 601-2 and the insulating layer 606A, filling the openings 61 to form electrically conductive lines 602-1, 602-2. The layer of electrically conductive material 65 may be formed by evaporation, sputtering, or electroplating, and may be a layer of copper, aluminum, or any other suitable electrically conductive material. A CMP step is performed removing the excess conductive material and exposing the surfaces of the insulating layer 606A, the transmission lines 601-1, 601-2, and the electrically conductive lines 602-1, 602-2, as shown in FIG. 6E.

The structure 600 may be completed as described in connection with FIG. 3J, except that a sandwich layer 605 is formed over the insulating layer 606. Otherwise stated, a shield layer 605B is formed between the insulating layer 606 and the conductive plane 605A. Thereby, the structure 600 depicted in FIG. 6A is achieved.

FIG. 7 illustrates neighboring transmission lines in accordance with a sixth embodiment of the invention. A number of transmission lines 701-1, 701-2 are spaced between a number of electrically conductive lines 702-1, 702-2, which are grounded. For simplicity, a pair of transmission lines 701-1, 701-2 and a pair of electrically conductive lines 702-1, 702-2 are shown, but the invention has applicability to any number of transmission lines spaced between any number of electrically conductive lines. Preferably, the transmission lines 701-1, 701-2 and the electrically conductive lines 702-1, 702-2 are spaced parallel to one another.

The transmission lines 701-1, 701-2 are spaced between sandwich layers 704 and 705. Further, in this embodiment, the electrically conductive lines 702-1, 702-2 include shield layers 715 formed on a number of surfaces thereof. Preferably, shield layers 715 are formed on three surfaces of the electrically conductive lines 702-1, 702-2, including opposing sides adjacent to the transmission lines 701-1, 702, and on a side adjacent to the sandwich layer 704.

As is known in the art, an electrical signal transmitted via the transmission lines 701-1, 701-2 will induce a magnetic field surrounding the transmission lines 701-1, 701-2. Such a magnetic field is illustrated by magnetic field lines 711. The shield layers 715 formed on a number of surfaces of the electrically conductive lines 702-1, 702-2, and the shield layers 704B and 705B of sandwich layers 704 and 705 respectively, serve to shield the transmission lines 701-1, 701-2 from such electrically induced magnetic fields. The magnetic field lines 711 illustrate this magnetic shielding effect. Also, the conductive planes 704A, 705A and the number of electrically conductive lines 702-1, 702-2 provide electric field confinement.

The embodiment illustrated in FIG. 7 having a structure 700 is easy to manufacture, and is formed as described in connection with FIGS. 6B–6E with minor differences: a sandwich layer 704 is formed over the substrate (not shown), and the shield layers 715 are formed on the electrically conductive lines 702-1, 702-1, instead of on the transmission lines 701-1, 701-2.

FIG. 7 is a configuration similar to that of FIG. 6A, but allows for more space to be used for the transmission lines 701-1, 701-2, since they are not covered by shield material.

The conductive planes described in connection with the different embodiments may be independently coupled to a ground or power supply bus. Further, the insulating layer described in connection with the different embodiments may be an oxide layer or other low k dielectric.

Figure 8:
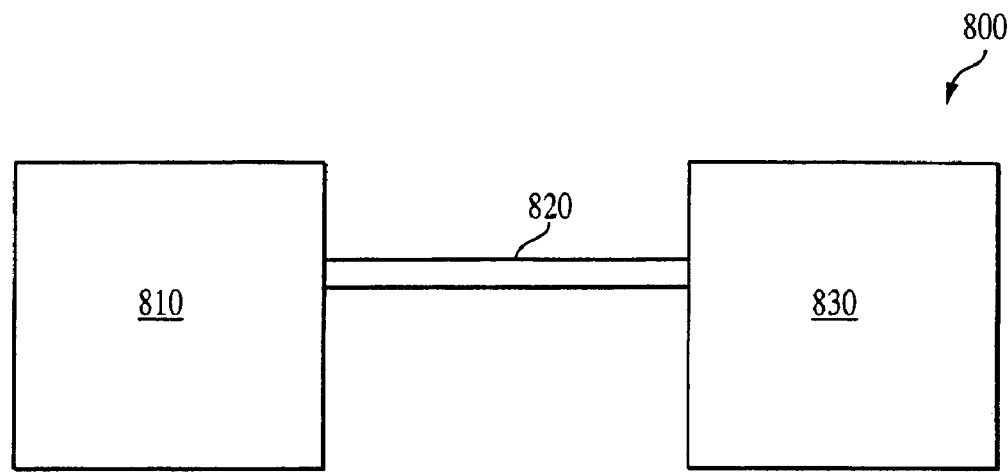
FIG. 8 is a block diagram of a system employing an interconnection structure in accordance with a seventh exemplary embodiment of the invention.

FIG. 8 is a block diagram of a system employing a transmission line circuit in accordance with a seventh exemplary embodiment of the invention. The system 800 uses current signaling. The system 800 includes a low output impedance driver 810. The low output impedance driver 810 is coupled to a transmission line circuit 820. The transmission line circuit 820 is a transmission line circuit such as any one of the transmission line circuits described above in connection with FIGS. 2A–7. Also the system 800 includes a termination circuit 830 having a termination impedance that is matched to the impedance of the transmission line circuit 820.

Figure 9:
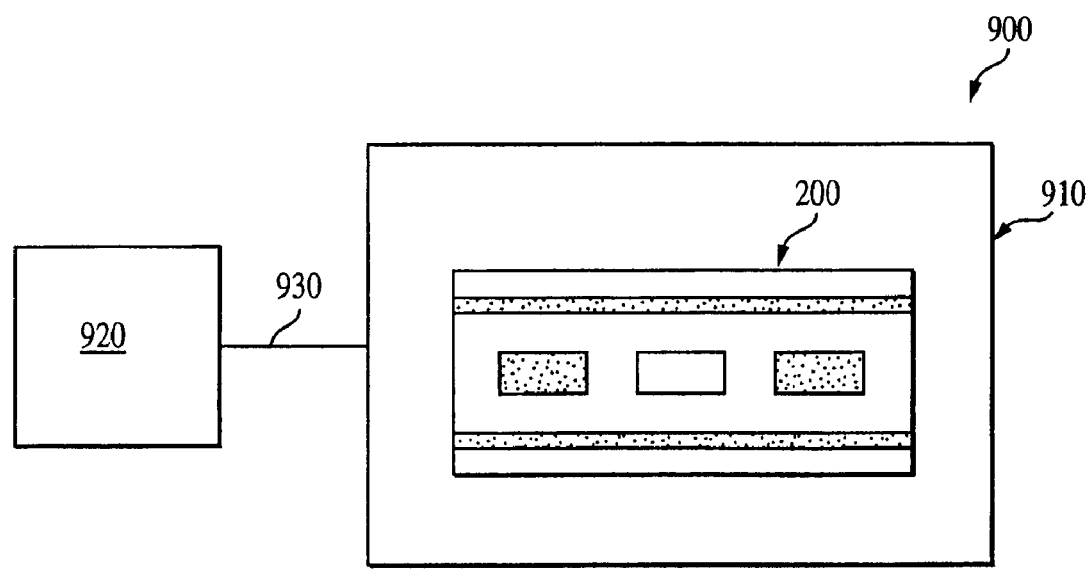
FIG. 9 is a block diagram of a system employing an interconnection structure in accordance with an eighth exemplary embodiment of the invention.

FIG. 9 is a block diagram of a system employing an interconnection structure in accordance with an eighth exemplary embodiment of the invention. The system 900 includes an integrated circuit 910. The integrated circuit 910 includes a transmission line circuit such as any one of the transmission line circuits described and presented above with reference to FIGS. 2A–7. For exemplary purposes the structure 200 of FIG. 2A is included in the integrated circuit 910. Additionally, the system 900 includes a processor 920 that is operatively coupled to the integrated circuit 910. The processor 920 is coupled to the integrated circuit 910 through a system bus 930.

Figure 10:
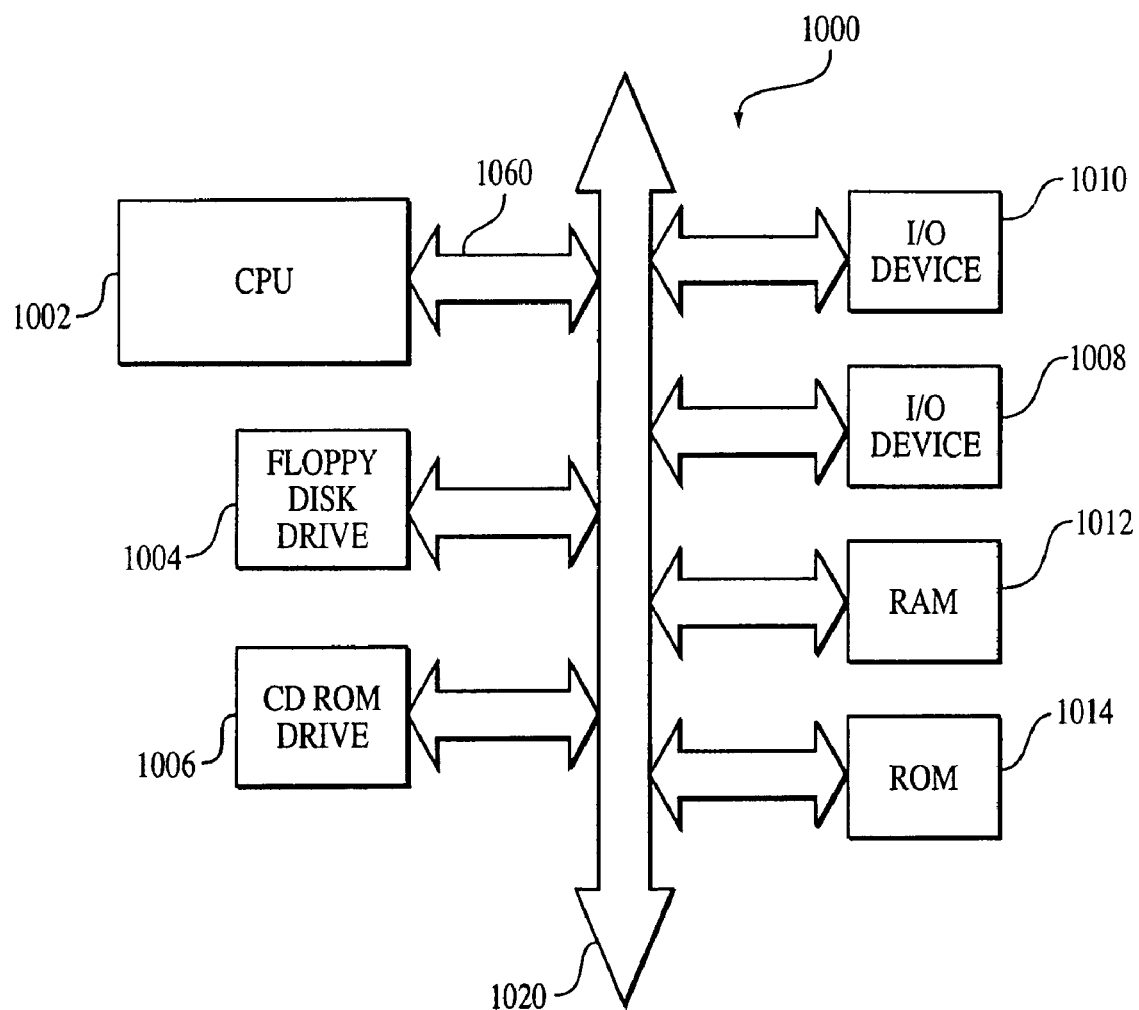
FIG. 10 is a block diagram of a system employing an interconnection structure in accordance with a ninth exemplary embodiment of the invention

FIG. 10 is a block diagram of a system employing an interconnection structure in accordance with a ninth exemplary embodiment of the invention FIG. 10 depicts a processor-based system 1000 utilizing a transmission line circuit such as any one of the transmission line circuits described above in connection with FIGS. 2A–7. For example, bus 1060 coupling the CPU 1002 with the bus 1020 contains a transmission line structure 200, as depicted in FIG. 2A. The processor-based system 1000 may be a computer system, a process control system or any other system employing a processor and associated memory.

The system 1000 includes a central processing unit (CPU) 1002, e.g., a microprocessor, that communicates with the RAM 1012 and an I/O device 1008 over a bus 1020. It must be noted that the bus 1020 may be a series of buses and bridges commonly used in a processor-based system, but for convenience purposes only, the bus 1020 has been illustrated as a single bus.

A second I/O device 1010 is illustrated, but is not necessary to practice the invention. The processor-based system 1000 also includes read-only memory (ROM) 1014 and may include peripheral devices such as a floppy disk drive 1004 and a compact disk (CD) ROM drive 1006 that also communicates with the CPU 1002 over the bus 1020 as is well known in the art.

According to the teachings of the present invention, inductive coupling can be minimized by: (i) magnetic shields above and below transmission lines, and/or (ii) magnetic shields between transmission lines. These magnetic shields may be: (i) manufactured using ALD techniques, where thin layers of the magnetic material are alternated by thin layers of insulators, on the order of 5 nanometers (nm), which can only be formed effectively by employing ALD techniques; (ii) formed so that the magnetic material deposited does not require high sintering or annealing temperatures; (iii) formed so that the layering structure prevents oxidation of the magnetic material; and (iv) able to provide good surface coverage with improved density and therefore superior magnetic properties.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention.

The invention claimed is:

1. A method comprising:
  forming a first insulating layer over a substrate;
  forming a transmission line over the first insulating layer;
  forming a magnetic shield structure over the first insulating layer to at least partially contain electrically induced magnetic fields generated around the transmission line, the magnetic shield structure having shield material including magnetic material and insulating material; and
  forming a second insulating layer over the transmission line.

2. The method of claim 1, wherein forming a first insulating layer includes forming an oxide layer.

3. The method of claim 1, wherein the method further includes: forming a first conductive plane over the substrate and below the first insulating layer; and forming a second conductive plane over the second insulating layer.

4. The method of claim 3, wherein the method further includes forming a shield structure on a surface of at least one of the first and second conductive planes.

5. The method of claim 3, wherein the method further includes coupling at least one of the first or the second conductive planes to one of a power supply or a ground bus.

6. The method of claim 1, wherein forming a magnetic shield structure includes forming alternating films of the magnetic material and the insulating material.

7. The method of claim 6, wherein forming alternating films of the magnetic material and the insulating material includes:
   forming a film of Ni;
   forming a film of Fe; and
   continuing to alternately form a film of Ni and a film of Fe until a predetermined thickness of a NiFe film is formed.

8. The method of claim 7, wherein forming a magnetic shield structure includes forming a film of insulating material on or beneath the NiFe film, such that the shield material includes a NiFe/insulating material structure.

9. The method of claim 8, wherein forming a film of insulating material includes forming a film of $SiO_2$.

10. The method of claim 8, wherein the method further includes forming a plurality of NiFe films and a plurality of films of insulating material, such that the shield material has a repetitive NiFe/insulating material structure.

11. The method of claim 9, wherein forming the magnetic shield structure includes forming the magnetic shield structure such that a Fe film does not contact the $SiO_2$ film.

12. The method of claim 6, wherein forming alternating films of magnetic material and insulating material includes forming a film of Fe.

13. The method of claim 12, wherein forming alternating films of magnetic material and insulating material includes alternately forming a film of insulating material and a film of Fe until a predetermined thickness of an Fe/insulating material film is reached.

14. The method of claim 13, wherein the method further includes forming a film of insulating material on or beneath the Fe/insulating material film, such that the shield material has a (Fe/insulating material)/insulating material structure.

15. The method of claim 14, wherein the method further includes forming a plurality of Fe/insulating material films and a plurality of films of insulating material, such that the shield material has a repetitive (Fe/insulating material)/insulating material structure.

16. The method of claim 13, wherein at least one of forming a film of insulating material in the Fe/insulating material film or forming a film of insulating material over or beneath the Fe/insulating material film includes forming a layer of $SiO_2$.

17. The method of claim 1, wherein forming a magnetic shield structure includes forming a number of shield lines over the first insulating layer such that a number of transmission lines are between and parallel to the shield lines.

18. The method of claim 17, wherein forming the magnetic shield structure includes forming layers of shield material on at least two surfaces of the transmission lines.

19. The method of claim 18, wherein forming layers of shield material on at least two surfaces includes forming layers of shield material on opposing sides, one side being adjacent to the substrate.

20. The method of claim 1, wherein the method further includes forming a number of transmission lines and a number of electrically conductive lines over the first insulating layer such that the transmission lines are between and parallel to the electrically conductive lines, the electrically conductive lines being grounded.

21. The method of claim 20, wherein forming a magnetic shield structure includes forming a shield layer of the shield material on two surfaces on the transmission lines or the electrically conductive lines or on two surfaces on the transmission lines and on two surfaces on the electrically conductive lines.

22. The method of claim 21, wherein forming a shield layer on two surfaces includes forming a shield layer on three sides of the transmission lines and on three sides of the electrically conductive lines, the sides including opposing sides adjacent to the electrically conductive lines and the transmission lines respectively, and a side adjacent to the substrate.

23. The method of claim 21, wherein forming a shield layer on two surfaces includes forming a shield layer on three sides of the transmission lines, the two sides including opposing sides adjacent to the electrically conductive lines, and a side adjacent to the substrate.

24. The method of claim 21, wherein forming a shield layer on two surfaces includes forming a shield layer on three sides of the electrically conductive lines, the three sides including opposing sides adjacent to the transmission lines, and a side adjacent to the substrate.

25. The method of claim 21, wherein forming a shield layer on two surfaces includes forming a shield layer on two sides of the electrically conductive lines, wherein the sides are opposing sides adjacent to the transmission lines.

26. A method comprising:
   forming a first layer of electrically conductive material over a substrate;
   forming a first insulating layer over the first layer of electrically conductive material;
   forming a transmission line on the first insulating layer;
   forming a shield line adjacent and parallel to the transmission line, the shield line having shield material including magnetic material and insulating material;
   forming a second insulating layer over the transmission line and the shield line;
   forming a second layer of electrically conductive material over the second insulating layer.

27. The method of claim 26, wherein forming a shield line adjacent and parallel to the transmission line includes forming the shield material with alternating films of the magnetic material and the insulating material.

28. The method of claim 26, wherein the method further includes forming a layer of shield material on two surfaces of the transmission line.

29. The method of claim 26, wherein the method further includes forming a layer of shield material on a surface of at least one of the first layer of electrically conductive material or the second layer of electrically conductive material.

30. A method comprising:
   forming a first insulating layer over a substrate;
   forming a transmission line on the first insulating layer;
   forming an electrically conductive line adjacent and parallel to the transmission line, the electrically conductive line being grounded;
   forming a layer of shield material on two surfaces of at least one of the transmission line or the electrically conductive line, the shield material including alternating films of magnetic material and insulating material;
   forming a second insulating layer over the transmission line and the shield line material.

31. The method of claim 30, wherein forming a layer of shield material includes forming a layer of shield material on the transmission line and on the electrically conductive line.

32. The method of claim 30, wherein the method further includes:
   forming a first layer of electrically conductive material between the substrate and the first insulating layer; and
   forming a second layer of electrically conductive material over the second insulating layer.

33. The method of claim 32, wherein the method further includes forming a layer of shield material on a surface of at least one of the first layer of electrically conductive material or the second layer of electrically conductive material.

34. An apparatus comprising:
a substrate;
a first insulating layer over the substrate;
a transmission line over the first insulating layer;
a magnetic shield structure over the first insulating layer to at least partially contain electrically induced magnetic fields generated around the transmission line, wherein the magnetic shield structure has shield material including magnetic material and insulating material; and
a second insulating layer over the transmission line.

35. The apparatus of claim 34, wherein the shield material includes a film of the magnetic material and a film of the insulating material.

36. The apparatus of claim 34, wherein a first end of the transmission line is coupled to a low output impedance driver having a driver impedance, and a second end of the transmission line is coupled to a termination circuit having a termination impedance that is matched to the driver impedance.

37. The apparatus of claim 34, wherein the first and second insulating layers are oxide layers.

38. The apparatus of claim 34, further including:
a first conductive plane over the substrate and below the first insulating layer; and
a second conductive plane over the second insulating layer.

39. The apparatus of claim 38, wherein at least one of the first conductive plane or the second conductive plane is coupled to one of a power supply or a ground bus.

40. The apparatus of claim 38, further including a magnetic shield structure on a surface of at least one of the first conductive plane or the second conductive plane.

41. The apparatus of claim 34, wherein the magnetic material is a NiFe film having alternating films of Ni and Fe, and the insulating material is a $SiO_2$ film.

42. The apparatus of claim 41, wherein the shield material has a structure such that the Fe film does not contact the $SiO_2$ film.

43. The apparatus of claim 41, wherein the shield material includes a plurality of alternating films of NiFe and $SiO_2$, such that the shield material has a NiFe/$SiO_2$ structure.

44. The apparatus of claim 34, wherein the magnetic material is Fe and the insulating material is $SiO_2$.

45. The apparatus of claim 44, wherein the shield material is a plurality of alternating films of Fe and $SiO_2$, such that the shield material has an (Fe/$SiO_2$)/$SiO_2$ structure.

46. The apparatus of claim 34, wherein the magnetic shield structure includes a plurality of shield lines such that a plurality of transmission lines is disposed between and parallel to the shield lines.

47. The apparatus of claim 46, further including a layer of shield material on two surfaces of the transmission lines.

48. The apparatus of claim 47, wherein the two surfaces are opposing sides, one side being adjacent to the substrate.

49. The apparatus of claim 34, further including a plurality of electrically conductive lines over the first insulating layer such that a plurality of transmission lines is disposed between and parallel to the electrically conductive lines, the electrically conductive lines being grounded.

50. The apparatus of claim 49, wherein the magnetic shield structure includes a shield layer of the shield material on two surfaces of at least the transmission lines or the electrically conductive lines or on two surfaces of the transmission lines and the electrically conductive lines.

51. The apparatus of claim 50, wherein the shield layer on two surfaces includes the shield layer on three sides of the transmission lines, the three sides including opposing sides adjacent to the electrically conductive lines and a side adjacent to the substrate.

52. The apparatus of claim 50, wherein the shield layer on two surfaces includes the shield layer on three sides of the electrically conductive lines, the three sides including opposing sides adjacent to the transmission lines, and a side adjacent to the substrate.

53. The apparatus of claim 50, wherein the shield layer on two surfaces includes the shield layer on two sides of the electrically conductive lines, wherein the two sides are opposing sides adjacent to the transmission lines.

54. The apparatus of claim 50, wherein the shield layer on two surfaces includes the shield layer on three sides of the transmission lines and three sides of the electrically conductive lines, the three sides including opposing sides adjacent to the electrically conductive lines and the transmission lines respectively, and a side adjacent to the substrate.

55. The apparatus of claim 34, wherein the apparatus includes an integrated circuit and the transmission line is an integrated circuit line.

56. An apparatus comprising:
a first layer of electrically conductive material over a substrate;
a first insulating layer over the first layer of electrically conductive material;
a transmission line on the first insulating layer;
a shield line adjacent and parallel to the transmission line, the shield line having shield material including alternating layers of magnetic material and insulating material;
a second insulating layer over the transmission line and the shield line;
a second layer of electrically conductive material over the second insulating layer.

57. The apparatus of claim 56, further including a layer of shield material on two surfaces of the transmission line.

58. The apparatus of claim 56, further including a layer of shield material on a surface of at least one of the first layer of electrically conductive material or the second layer of electrically conductive material.

59. An apparatus comprising:
a first layer of electrically conductive material on a substrate;
a first insulating layer disposed on the first layer of electrically conductive material;
a transmission line on the first insulating layer;
an electrically conductive line adjacent and parallel to the transmission line, the electrically conductive line being grounded;
a layer of shield material on two surfaces of at least one of the transmission line or the electrically conductive line, the shield material including alternating layers of high permeability magnetic material and insulating material;
a second insulating layer over the transmission line and the shield line; and
a second layer of electrically conductive material over the second insulating layer.

60. The apparatus of claim 59, wherein a layer of shield material is on the transmission line and the electrically conductive line.

61. The apparatus of claim 59, further including a layer of shield material on a surface of at least one of the first layer of electrically conductive material or the second layer of electrically conductive material.

62. A system, comprising:
a processor;
an integrated circuit coupled to the processor, wherein the integrated circuit includes:
  a substrate;
  a first insulating layer over the substrate;
  a transmission line over the first insulating layer;
  a magnetic shield structure over the first insulating layer to at least partially contain electrically induced magnetic fields generated around the transmission line, the magnetic shield structure having shield material including layers of magnetic material and insulating material; and
  a second insulating layer over the transmission line.

63. The system of claim 62, wherein a first end of the transmission line is coupled to a low output impedance driver having a driver impedance, and a second end of the transmission line is coupled to a termination circuit having a termination impedance that is matched to the driver impedance.

64. The system of claim 62, wherein the first and second insulating layers are oxide layers.

65. The system of claim 62, further comprising:
a first conductive plane over the substrate and below the first insulating layer; and
a second conductive plane over the second insulating layer.

66. The system of claim 65, wherein at least one of the first conductive plane or the second conductive plane is coupled to one of a power supply or a ground bus.

67. The system of claim 65, further including a magnetic shield structure on a surface of at least one of the first conductive plane or the second conductive plane.

68. The system of claim 62, wherein the magnetic material is a NiFe film having alternating films of Ni and Fe, and the insulating material is a $SiO_2$ film.

69. The system of claim 68, wherein the shield material film has a structure such that the Fe film does not contact the $SiO_2$ film.

70. The system of claim 68, wherein the shield material is a plurality of alternating films of NiFe and $SiO_2$, such that the shield material has a $NiFe/SiO_2$ structure.

71. The system of claim 62, wherein the magnetic material is Fe and the insulating material is $SiO_2$.

72. The system of claim 71, wherein the shield material is a plurality of alternating films of Fe and $SiO_2$, such that the magnetic material has an $(Fe/SiO_2)/SiO_2$ structure.

73. The system of claim 62, wherein the magnetic shield structure is a plurality of shield lines such that a plurality of transmission lines is disposed between and parallel to the shield lines.

74. The system of claim 73, further including a layer of shield material on two surfaces of the transmission lines.

75. The system of claim 74, wherein the two surfaces are opposing sides, one side being adjacent to the substrate.

76. The system of claim 62, further including a plurality of electrically conductive lines over the first insulating layer such that a plurality of transmission lines is disposed between and parallel to the electrically conductive lines, the electrically conductive lines being grounded.

77. The system of claim 76, wherein the magnetic shield structure includes a shield layer of the shield material on two surfaces of the transmission lines or the electrically conductive lines or on two surfaces of the transmission lines and two surfaces of the electrically conductive lines.

* * * * *

UNITED STATES PATENT AND TRADEMARK OFFICE
CERTIFICATE OF CORRECTION

| | | |
|---|---|---|
| PATENT NO. | : 7,154,354 B2 | Page 1 of 1 |
| APPLICATION NO. | : 11/063132 | |
| DATED | : December 26, 2006 | |
| INVENTOR(S) | : Akram et al. | |

It is certified that error appears in the above-identified patent and that said Letters Patent is hereby corrected as shown below:

In column 16, line 58, in Claim 30, after "shield" delete "line".

Signed and Sealed this

Thirteenth Day of March, 2007

JON W. DUDAS
*Director of the United States Patent and Trademark Office*